(12) United States Patent
Nakamura et al.

(10) Patent No.: US 8,773,165 B2
(45) Date of Patent: Jul. 8, 2014

(54) LOGIC CIRCUIT PERFORMING EXCLUSIVE OR OPERATION AND DATA PROCESSING SYSTEM INCLUDING THE SAME

(71) Applicant: Elpida Memory, Inc., Tokyo (JP)

(72) Inventors: Yuki Nakamura, Tokyo (JP); Chiaki Dono, Tokyo (JP); Ronny Schneider, Tokyo (JP)

(*) Notice: Subject to any disclaimer, the term of this patent is extended or adjusted under 35 U.S.C. 154(b) by 84 days.

(21) Appl. No.: 13/630,612

(22) Filed: Sep. 28, 2012

(65) Prior Publication Data

US 2013/0082735 A1   Apr. 4, 2013

(30) Foreign Application Priority Data

Sep. 29, 2011   (JP) .................................. 2011-213697

(51) Int. Cl.
    *H03K 19/21* (2006.01)
(52) U.S. Cl.
    CPC .............. *H03K 19/215* (2013.01); *H03K 19/21* (2013.01)
    USPC .................. 326/55; 326/52; 326/54; 326/104; 326/114; 326/122
(58) Field of Classification Search
    CPC .. H03K 19/21; H03K 19/215; H03K 19/0948
    USPC ................ 326/53, 54–55, 104, 112, 114, 122
    See application file for complete search history.

(56) References Cited

U.S. PATENT DOCUMENTS

| | | | | |
|---|---|---|---|---|
| 4,739,195 A * | 4/1988 | Masaki | ........................... | 326/55 |
| 6,137,309 A * | 10/2000 | Couteaux et al. | ............... | 326/55 |
| 7,242,219 B1 | 7/2007 | Mahurin et al. | | |
| 7,557,614 B1 * | 7/2009 | Bonsels et al. | .................. | 326/55 |
| 7,843,219 B2 * | 11/2010 | Moon | ........................... | 326/55 |
| 8,324,932 B2 * | 12/2012 | Shin et al. | ....................... | 326/54 |
| 2005/0135813 A1* | 6/2005 | Cao | .............................. | 398/140 |
| 2007/0008014 A1* | 1/2007 | Parris | ........................... | 326/121 |
| 2010/0090722 A1* | 4/2010 | Kao | .............................. | 326/103 |
| 2010/0329446 A1* | 12/2010 | Degrendel et al. | ............. | 380/28 |

FOREIGN PATENT DOCUMENTS

EP   0 905 907   3/1999

OTHER PUBLICATIONS

Extended European Search Report dated Jan. 17, 2013, directed to European Patent Application No. 12186396.3; 3 pages.
Oklobdzija V.G. et al. (Aug. 1995). "Development and Synthesis Method for Pass-Transistor Logic Family for High-Speed and Low Power CMOS," *Proceedings of the 38th Midwest Symposium: Circuits and Systems, IEEE* 1: 298-301.

(Continued)

*Primary Examiner* — Jason M Crawford

(57) ABSTRACT

Disclosed herein is a logic circuit that includes a transistor T1 coupled between VPERI and a node n1, a transistor T2 coupled between VPERI and a node n2, a transistor T3 coupled between VSS and a node n3, a transistor T4 coupled between VSS and a node n4, transistors T5 and T7 coupled in series between the nodes n1 and n3, transistors T9 and T11 coupled in series between the nodes n1 and n3, transistors T6 and T8 coupled in series between the nodes n2 and n4, and transistors T10 and T12 coupled in series between the nodes n2 and n4. An output signal Y is output from a connection point of the transistors T5 and T7 and a connection point of the transistors T6 and T8.

14 Claims, 13 Drawing Sheets

(56) References Cited

OTHER PUBLICATIONS

Ashok, K. G. "VLSI Design," located at <http://www.ece.mtu.edu/faculty/goel/EE-4271/Project-5.pdf > visited on Jun. 7, 2012. (2 pages).

Gengi. "XOR Gate," located at <http://genjix.ddo.jp/home/daijin/xor/> visited on Jun. 7, 2012. (4 pages).

Dovrolis, C. (1999) "CMOS Circuit Design and Accusim Simulations," located at <http://pages.cs.wisc.edu/~david/courses/cs755/cs755/tutorials/tutorial5/tutorial5.html> visited on Jun. 7, 2012. (5 pages).

* cited by examiner

LOGIC CIRCUIT PERFORMING EXCLUSIVE OR OPERATION AND DATA PROCESSING SYSTEM INCLUDING THE SAME

BACKGROUND OF THE INVENTION

1. Field of the Invention

The present invention relates to a logic circuit, and particularly to a logic circuit that generates exclusive OR (XOR) signal and exclusive NOR (XNOR) signal at the same time. The present invention also relates to a semiconductor device and a data processing system that include the logic circuit.

2. Description of Related Art

DDR4 (Double Data Rate 4), which is a next-generation standard of DRAM (Dynamic Random Access Memory), is expected to have more input/output errors due to a higher operational speed thereof. Therefore, a CRC (Cyclic Redundancy Check) code is added to input data and output data that are transferred via data input/output terminals.

The CRC code is generated in both a transmitter and receiver of data signals. A first CRC code that is generated by the transmitter on the basis of data signals is transmitted to the receiver along with the data signals. The receiver generates a second CRC code on the basis of the data signals received, and compares the second CRC code with the received first CRC code. If the first CRC code matches the second CRC code, then the receiver accepts the data signals. If the first CRC code does not match the second CRC code, then the receiver notifies the transmitter of the fact that the first CRC code does not match the second CRC code.

The data signals that are input and output in DDR4 DRAM may be 72-bit data including 64-bit read or write data and 8-bit DBI (Data Bus Inversion) data. The CRC code is made up of eight bits, and is generated based on a plurality of bits selected from among the 72 bits. To generate the CRC code, exclusive OR circuit is used. More specifically, two sets of a plurality of bits selected are selected, and the exclusive OR signal of those selected is calculated; then two calculation results are selected, and the exclusive OR signal of those selected is calculated. The above calculation process is repeated until 1-bit data is eventually obtained. The CRC code that is calculated as described above is "1" at a time when the number of bits equal to "1" among a plurality of bits selected is odd; otherwise the CRC code is "0."

In generating the CRC codes, exclusive OR operation is frequently used as in the above case, requiring a large number of XOR gate circuits. As for the specific circuit configuration of the XOR gate circuits, various types are known. Some examples are disclosed in: Ashok K. Goel, "VLSI Design", [online], Michigan Technological University, [searched on Sep. 15, 2011], Internet <URL:http://www.ece.mtu.edu/faculty/goel/EE-4271/Project-5.pdf>; genji, "XOR Gate", [online], [searched on Sep. 15, 2011], Internet <URL:http://genjix.ddo.jp/home/daijin/xor/>; and Constantinos Dovrolis, "CMOS Circuit Design and Accusim Simulations", [online], University of Wisconsin, [searched on Sep. 15, 2011], Internet <URL:http://pages.cs.wisc.edu/~david/courses/cs755/cs755/tutorials/tutorial5/tutorial5.html>

However, the XOR gate circuits that have so far been known have various problems, including: a larger number of elements, which leads to an increase in circuitry area; a larger number of transistors that signals pass through, which results in an increase in delay; and the circuits themselves not having a driver capability, causing waveforms to become dull. Therefore, there is the need for an XOR gate circuit that can solve the above problems.

SUMMARY

In one embodiment, there is provided a device that includes: a first terminal supplied with a first potential; a second terminal supplied with a second potential; a first transistor coupled between the first terminal and a first node and including a control electrode supplied with a first signal; a second transistor coupled between the first terminal and a second node and including a control electrode supplied with an inverted signal of the first signal; a third transistor coupled between the second terminal and a third node and including a control electrode supplied with a second signal; a fourth transistor coupled between the second terminal and a fourth node and including a control electrode supplied with an inverted signal of the second signal; a fifth transistor coupled between the first node and a first output node and including a control electrode supplied with the inverted signal of the second signal; a sixth transistor coupled between the second node and the first output node and including a control electrode supplied with the second signal; a seventh transistor coupled between the third node and the first output node and including a control electrode supplied with the first signal; an eighth transistor coupled between the fourth node and the first output node and including a control electrode supplied with the inverted signal of the first signal; a ninth transistor coupled between the first node and a second output node and including a control electrode supplied with the second signal; a tenth transistor coupled between the second node and the second output node and including a control electrode supplied with the inverted signal of the second signal; an eleventh transistor coupled between the third node and the second output node and including a control electrode supplied with the inverted signal of the first signal; and a twelfth transistor coupled between the fourth node and the second output node and including a control electrode supplied with the first signal.

In another embodiment, there is provided a device that includes: first and second potential lines; first, second, third and fourth input nodes; first and second output nodes; first, second, third and fourth circuit nodes; a first transistor coupled between the first potential line and the first circuit node and including a gate coupled to the first input node; a second transistor coupled between the first potential line and the second circuit node and including a gate coupled to the second input node; a third transistor coupled between the second potential line and the third circuit node and including a gate coupled to the third input node; a fourth transistor coupled between the second potential line and the fourth circuit node and including a gate coupled to the fourth input node; a fifth transistor coupled between the first circuit node and the first output node and including a gate coupled to the fourth input node; a sixth transistor coupled between the second circuit node and the first output node and including a gate coupled to the third input node; a seventh transistor coupled between the third circuit node and the first output node and including a gate coupled to the first input node; an eighth transistor coupled between the fourth circuit node and the first output node and including a gate coupled to the second input node; a ninth transistor coupled between the first circuit node and the second output node and including a gate coupled to the third input node; a tenth transistor coupled between the second circuit node and the second output node and including a gate coupled to the fourth input node; an eleventh transistor coupled between the third circuit node and the second output node and including a gate coupled to the second input node; and a twelfth transistor coupled between the fourth circuit node and the second output node and including a gate coupled to the first input node.

In still another embodiment, there is provided a data processing system that includes the device and a controller that controls the device.

According to the present invention, the logic circuit that functions as an XOR gate circuit and an XNOR gate circuit can be made up of a small number of transistors, or 12 transistors. Moreover, in any logic state, the number of transistors that the output signals of the logic circuit pass through in the logic circuit is two. Therefore, it is possible to reduce the delay (critical path) associated with the signals passing through the transistors. Furthermore, in any logic state, the potential of the output signals is supplied from power supply lines (which means that the logic circuit itself has a driver capability). Therefore, it is possible to reduce the dullness of the waveforms.

DETAILED DESCRIPTION OF THE INVENTION

Figure 1A:
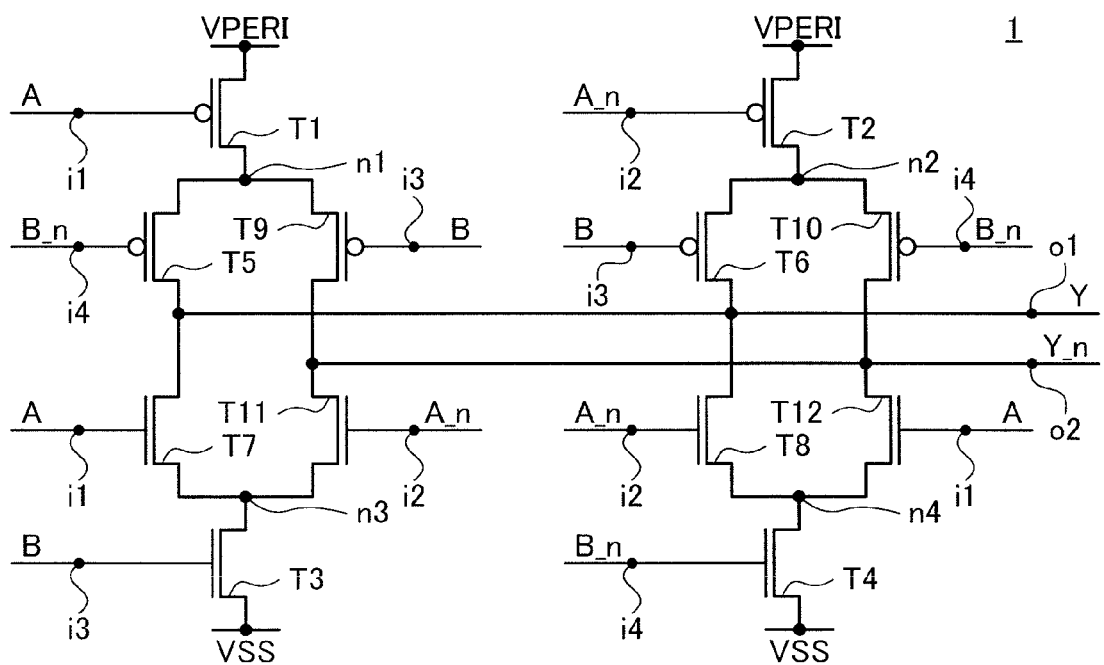
FIG. 1A is a circuit diagram of a logic circuit according to a first embodiment of the present invention.

One exemplary example of technical idea or concept of an embodiment of the present invention is described below. However, needless to say, what is claimed by the present application is not limited to the above technical idea, and is what is disclosed in the appended claims of the present application. That is, as shown in FIG. 1A, a circuit according to the present embodiment receives a first signal A and an inverted signal A_n thereof and a second signal B and an inverted signal B_n thereof, and generates a first output signal Y and an inverted signal Y_n thereof. The circuit is a logic circuit that includes: a first terminal supplied with a relatively high first power supply potential VPERI; a second terminal supplied with a relatively low second power supply potential VSS; a first transistor T1 whose one controlled terminal is connected to the first terminal (VPERI), and the other controlled terminal to a first node n1, and whose control terminal is supplied with the first signal A; a second transistor T2 whose one controlled terminal is connected to the first terminal (VPERI), and the other controlled terminal to a second node n2, and whose control terminal is supplied with the inverted signal A_n; a third transistor T3 whose one controlled terminal is connected to the second terminal (VSS), and the other controlled terminal to a third node n3, and whose control terminal is supplied with a second signal B; a fourth transistor T4 whose one controlled terminal is connected to the second terminal (VSS), and the other controlled terminal to a fourth node n4, and whose control terminal is supplied with an inverted signal B_n; a fifth transistor T5 whose one controlled terminal is connected to the first node n1, and the other controlled terminal to a first output node o1(Y), and whose control terminal is supplied with the inverted signal B_n; a sixth transistor T6 whose one controlled terminal is connected to the second node n2, and the other controlled terminal to the first output node o1(Y), and whose control terminal is supplied with the second signal B; a seventh transistor T7 whose one controlled terminal is connected to the third node n3, and the other controlled terminal to the first output node o1(Y), and whose control terminal is supplied with the first signal A; an eighth transistor T8 whose one controlled terminal is connected to the fourth node n4, and the other controlled terminal to the first output node o1(Y), and whose control terminal is supplied with the inverted signal A_n; a ninth transistor T9 whose one controlled terminal is connected to the first node n1, and the other controlled terminal to the second output node o2(Y_n), and whose control terminal is supplied with the second signal B; a tenth transistor T10 whose one controlled terminal is connected to the second node n2, and the other controlled terminal to the second output node o2(Y_n), and whose control terminal is supplied with the inverted signal B_n; an eleventh transistor T11 whose one controlled terminal is connected to the third node n3, and the other controlled terminal to the second output node o2(Y_n), and whose control terminal is supplied with the inverted signal A_n; and a twelfth transistor T12 whose one controlled terminal is connected to the fourth node n4, and the other controlled terminal to the second output node o2(Y_n), and whose control terminal is supplied with the first signal A.

Hereinafter, with reference to the accompanying drawings, preferred embodiments of the present invention will be described in detail.

As shown in FIG. 1A, the logic circuit 1 includes first to twelfth transistors T1 to T12. According to the present embodiment, the conductivity type of the first, second, fifth, sixth, ninth, and tenth transistors T1, T2, T5, T6, T9, and T10 is opposite to the conductivity type of the third, fourth, seventh, eighth, eleventh, and twelfth transistors T3, T4, T7, T8, T11, and T12. More specifically, the former are P-channel MOS transistors, while the latter are N-channel MOS transistors.

Figure 1B:
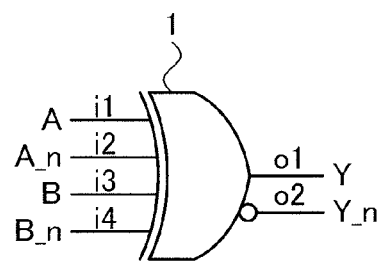
FIG. 1B shows a circuit symbol of the logic circuit shown in FIG. 1A.

As shown in FIG. 1B, the logic circuit 1 includes first to fourth input nodes i1 to i4, and first and second output nodes o1 and o2. The first signal A, the inverted signal A_n of the first signal A, the second signal B, and the inverted signal B_n of the second signal B are supplied to the first to fourth input nodes i1 to i4, respectively. The output signal Y and the inverted signal Y_n of the output signal Y are output from the first and second output nodes o1 and o2, respectively. Incidentally, in the present specification, a signal whose name ends with "_n" or starts with "/" means an inverted signal of a corresponding signal, or a low-active signal.

The connection relations between the first to twelfth transistors T1 to T12 have already been described in detail. The following describes the connection relations again from a different perspective. The first transistor T1 is connected between the power supply potential VPERI and the node n1. Similarly, the second transistor T2 is connected between the power supply potential VPERI and the node n2. The third transistor T3 is connected between the power supply potential VSS and the node n3. The fourth transistor T4 is connected between the power supply potential VSS and the node n4.

The fifth and seventh transistors T5 and T7 are connected in series between the node n1 and the node n3 in that order. Similarly, the ninth and eleventh transistors T9 and T11 are connected in series between the node n1 and the node n3 in that order. The sixth and eighth transistors T6 and T8 are connected in series between the node n2 and the node n4 in that order. The tenth and twelfth transistors T10 and T12 are connected in series between the node n2 and the node n4 in that order.

The first input node it is connected to the control terminals of the first, seventh, and twelfth transistors T1, T7, and T12; accordingly, the first signal A is supplied to the control terminals of the above transistors. The second input node i2 is connected to the control terminals of the second, eighth, and eleventh transistors T2, T8, and T11; accordingly, the inverted signal A_n of the first signal A is supplied to the control terminals of the above transistors. The third input node i3 is connected to the control terminals of the third, sixth, and ninth transistors T3, T6, and T9; accordingly, the second signal B is supplied to the control terminals of the above transistors. The fourth input node i4 is connected to the control terminals of the fourth, fifth, and tenth transistors T4, T5, and T10; accordingly, the inverted signal B_n of the second signal B is supplied to the control terminals of the above transistors.

The first output node of is connected to both a connection point of the transistors T5 and T7 and a connection point of the transistors T6 and T8. The second output node o2 is connected to both a connection point of the transistors T9 and T11 and a connection point of the transistors T10 and T12.

An operation of the logic circuit 1 is explained in detail with reference to FIGS. 2A, 2B, 3A, and 3B.

Figure 2A:
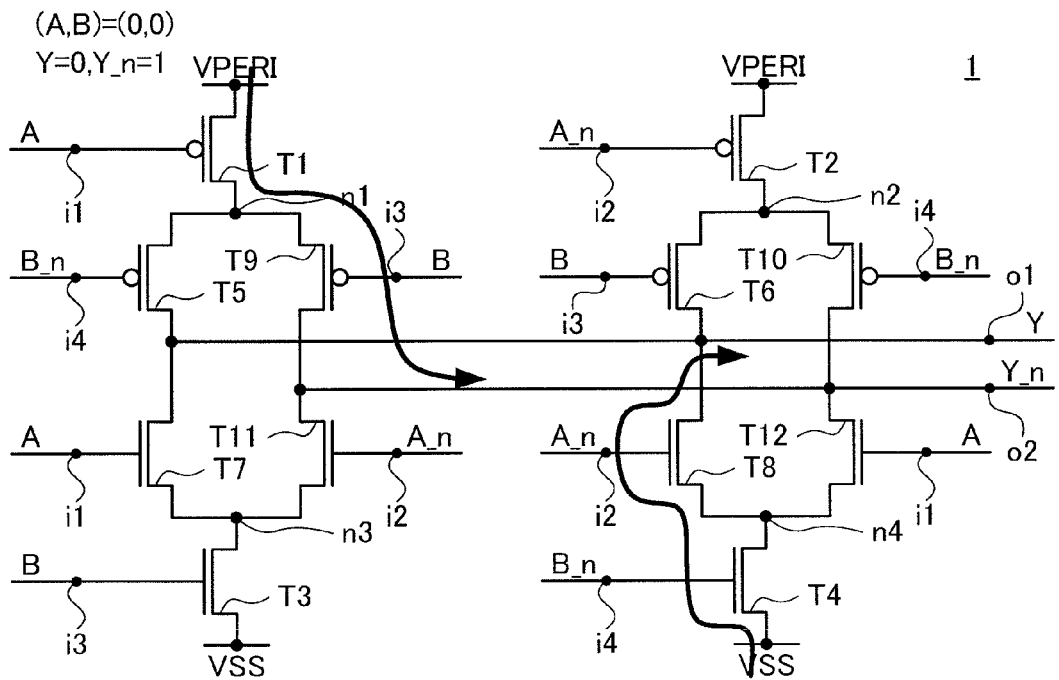
FIGS. 2A, 2B, 3A, and 3B are diagrams for explaining an operation of the logic circuit shown in FIG. 1A.

FIG. 2A shows the case where both the logic levels of the first signal A and the second signal B are "0." In this case, the transistors that are turned ON are the first, fourth, sixth, eighth, ninth, and eleventh transistors T1, T4, T6, T8, T9, and T11. Accordingly, as shown in FIG. 2A, the first output node o1 is connected to the power supply potential VSS via the fourth and eighth transistors T4 and T8. That is, the logic level of the output signal Y is "0." Meanwhile, the second output node o2 is connected to the power supply potential VPERI via the first and ninth transistors T1 and T9. That is, the logic level of the output signal Y_n is "1."

Figure 2B:
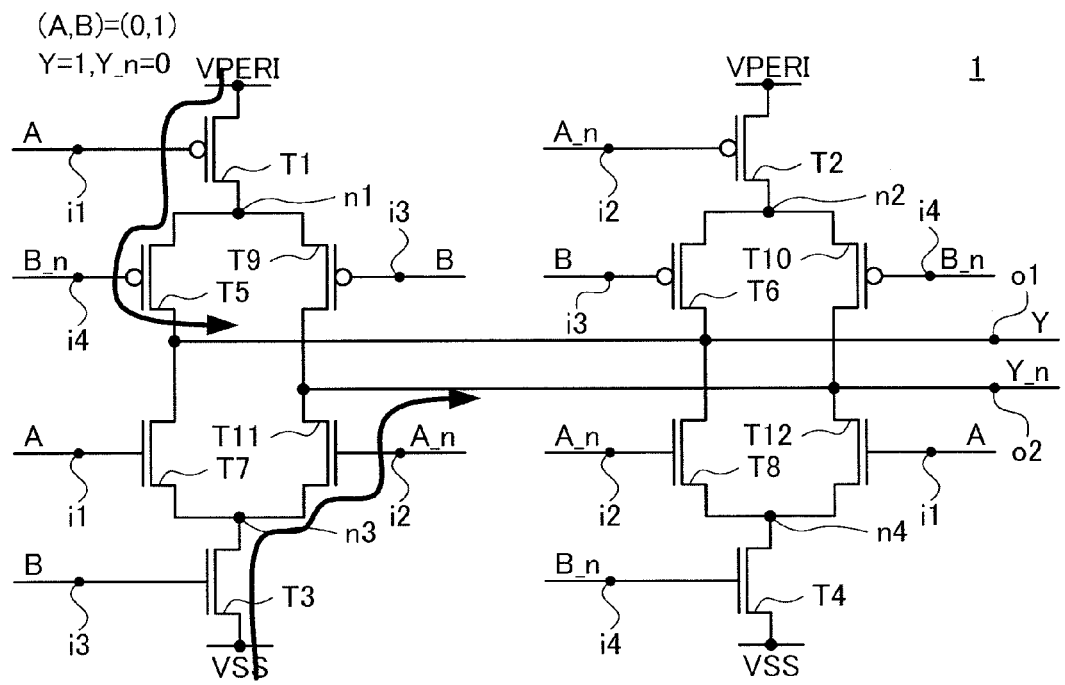

FIG. 2B shows the case where the logic levels of the first signal A and the second signal B are "0" and "1," respectively. In this case, the transistors that are turned ON are the first, third, fifth, eighth, tenth, and eleventh transistors T1, T3, T5, T8, T10, and T11. Accordingly, as shown in FIG. 2B, the first output node o1 is connected to the power supply potential VPERI via the first and fifth transistors T1 and T5. That is, the logic level of the output signal Y is "1." Meanwhile, the second output node o2 is connected to the power supply potential VSS via the third and eleventh transistors T3 and T11. That is, the logic level of the output signal Y_n is "0."

Figure 3A:
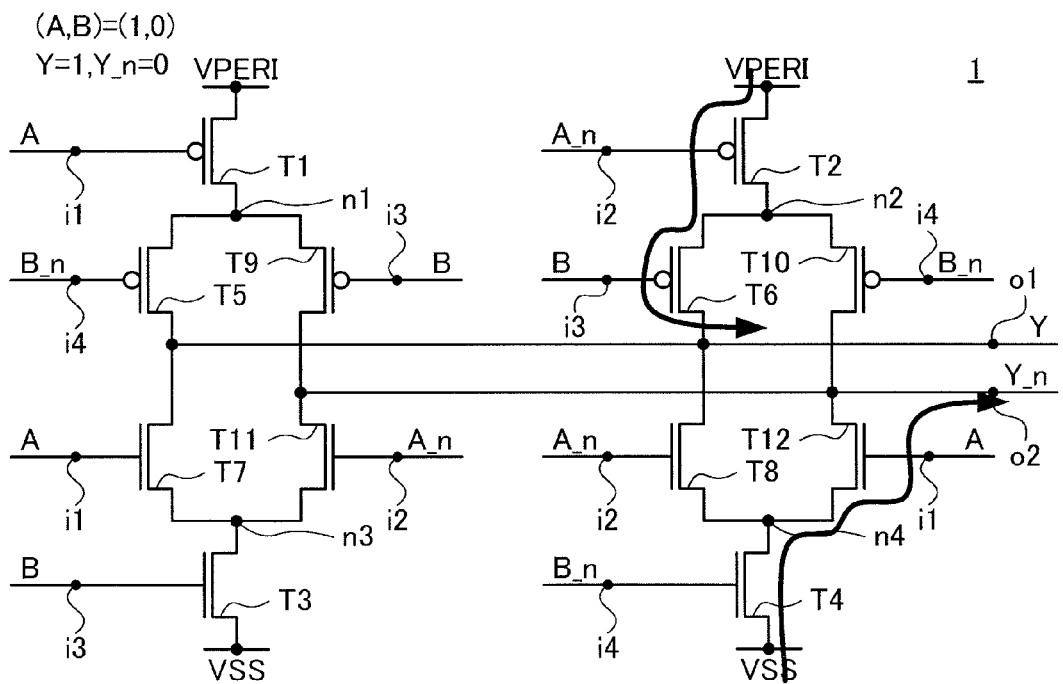

FIG. 3A shows the case where the logic levels of the first signal A and the second signal B are "1" and "0," respectively. In this case, the transistors that are turned ON are the second, fourth, sixth, seventh, ninth, and twelfth transistors T2, T4, T6, T7, T9, and T12. Accordingly, as shown in FIG. 3A, the first output node o1 is connected to the power supply potential VPERI via the second and sixth transistors T2 and T6. That is, the logic level of the output signal Y is "1." Meanwhile, the second output node o2 is connected to the power supply potential VSS via the forth and twelfth transistors T4 and T12. That is, the logic level of the output signal Y_n is "0."

Figure 3B:
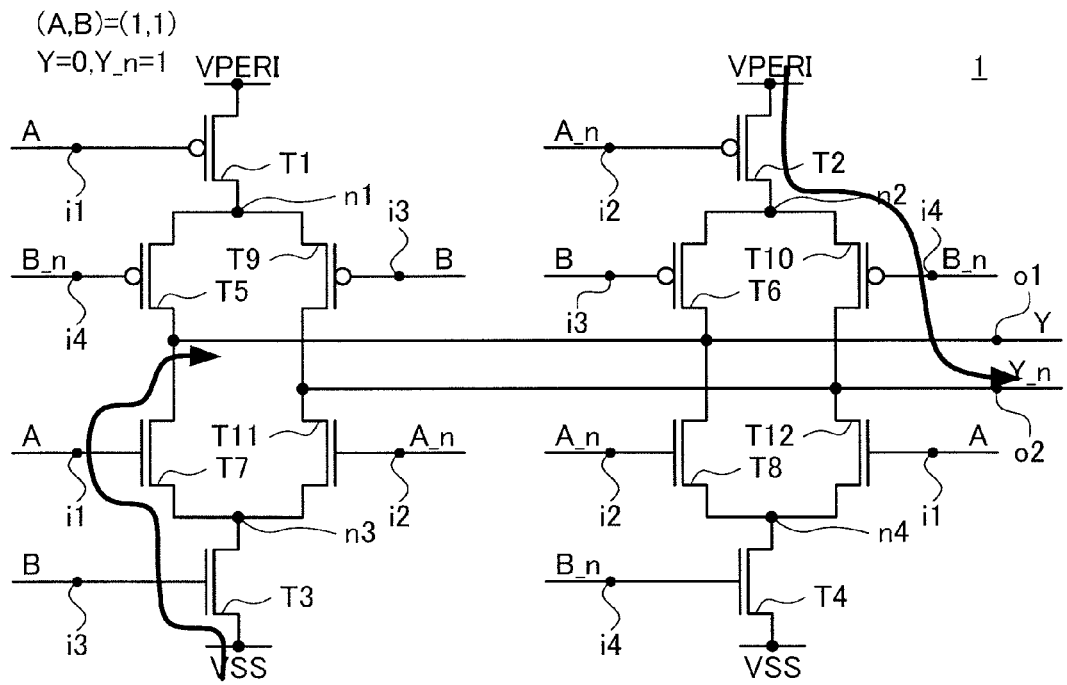

FIG. 3B shows the case where both the logic levels of the first signal A and the second signal B are "1." In this case, the transistors that are turned ON are the second, third, fifth, seventh, tenth, and twelfth transistors T2, T3, T5, T7, T10, and T12. Accordingly, as shown in FIG. 3B, the first output node of is connected to the power supply potential VSS via the third and seventh transistors T3 and T7. That is, the logic level of the output signal Y is "0." Meanwhile, the second output node o2 is connected to the power supply potential VPERI via the second and tenth transistors T2 and T10. That is, the logic level of the output signal Y_n is "1."

Figure 4:
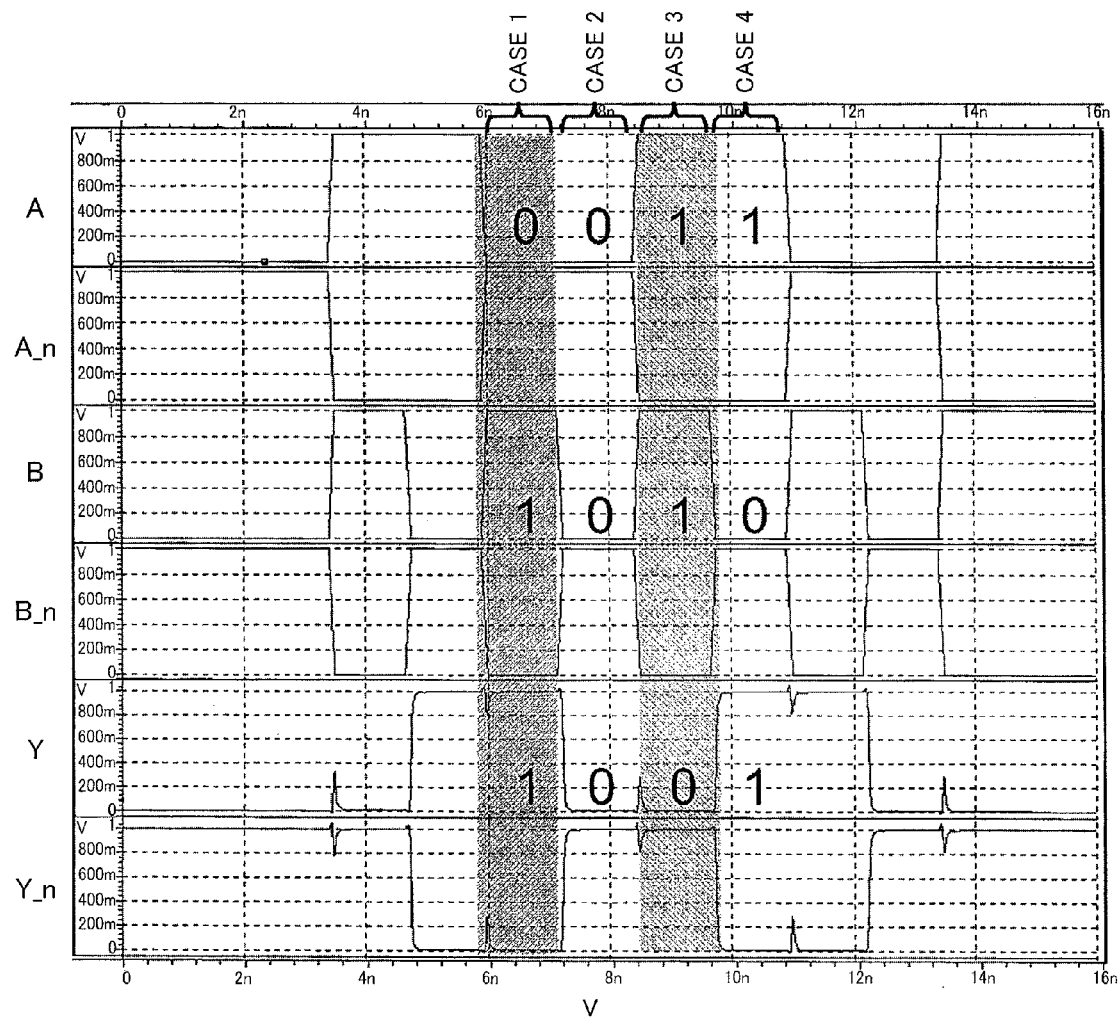
FIG. 4 is a diagram showing operational waveforms of the logic circuit shown in FIG. 1A.

FIG. 4 shows operational waveforms of the logic circuit 1. In the diagram, the horizontal axis represents time, and the vertical axis represents voltage. FIG. 4 shows the waveforms of the signals A, A_n, B, B_n, Y, and Y_n. Cases 1 to 4 shown in FIG. 4 respectively represent the cases where the combinations of the logic levels of the first and second signals A and B are (0, 1), (0, 0), (1, 1), and (1, 0).

As shown in FIG. 4, in Case 1 where the logic level of the first signal A is "0" and the logic level of the second signal B "1," the logic level of the signal Y therefore becomes "1." In Case 2 where the logic level of the first signal A is "0" and the logic level of the second signal B "0," the logic level of the signal Y therefore becomes "0." In Case 3 where the logic level of the first signal A is "1" and the logic level of the second signal B "1," the logic level of the signal Y therefore becomes "0." In Case 4 where the logic level of the first signal A is "1" and the logic level of the second signal B "0," the logic level of the signal Y therefore becomes "1."

It is clear from the above description that the output signal Y of the logic circuit 1 is the results of exclusive OR (XOR) operation of the first and second signals A and B. Moreover, the output signal Y_n is the results of exclusive NOR (XNOR) operation of the first and second signals A and B. In this manner, the logic circuit 1 realizes both an XOR gate circuit and an XNOR gate circuit with a small number of transistors, or with 12 transistors. In other words, the 12 transistors work together as one unit to generate both XOR logic and XNOR logic.

As described above with reference to FIGS. 2A, 2B, 3A, and 3B, in any logic state, the number of transistors that the output signals Y and Y_n of the logic circuit 1 pass through in the logic circuit 1 is two. Therefore, it is possible to reduce the delay associated with the signals passing through the transistors.

In the logic circuit 1, as described above with reference to FIGS. 2A, 2B, 3A, and 3B, in any logic state, the potential of the output signals Y and Y_n is supplied from the power supply lines, meaning that the logic circuit 1 itself has a driver capability. Therefore, it is possible to reduce the dullness of the waveforms of the output signals Y and Y_n. The following describes how the dullness of the waveforms is reduced, while making a comparison with prototype examples of the XOR gate circuit and the XNOR gate circuit with reference to FIGS. 5A and 5B.

Comparative Example

Figure 5A:
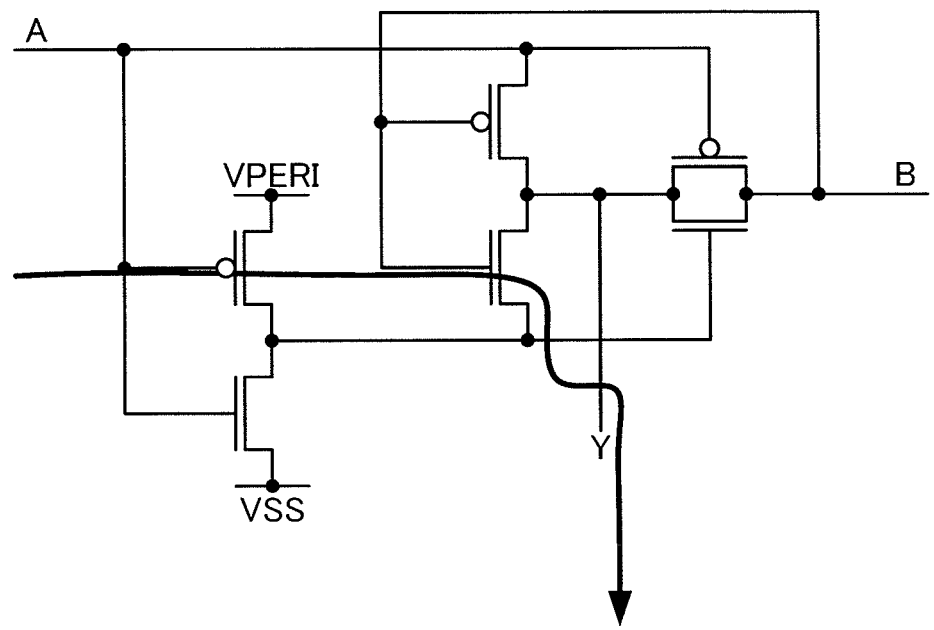
FIG. 5A shows one example of the XOR gate circuit that the inventors have conceived as a prototype in the course of making the present invention.
Figure 5B:
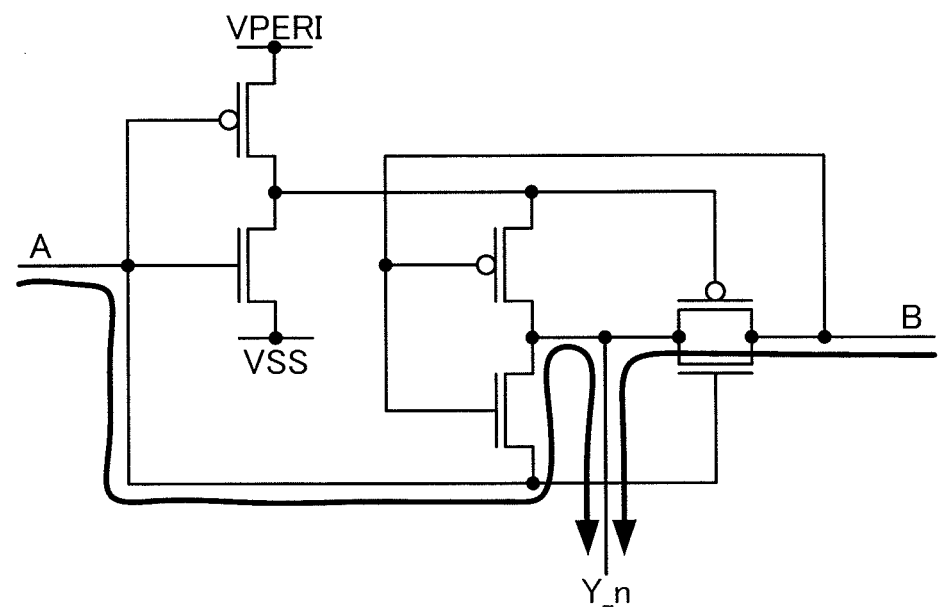
FIG. 5B shows one example of the XNOR gate circuit that the inventors have conceived as a prototype in the course of making the present invention.

The route indicated by bold arrow in FIG. 5A is a signal transmission route at a time when the logic level of the first signal A is "1" and the logic level of the second signal B "0." The routes indicated by bold arrow in FIG. 5B are signal transmission routes at a time when the logic level of the first signal A and the logic level of the second signal B are both "1." Given the above routes, there is no source of current for the output signals Y and Y_n in the logic circuit, meaning that the logic circuit does not have a driver capability at least in the above logic states.

Figure 6:
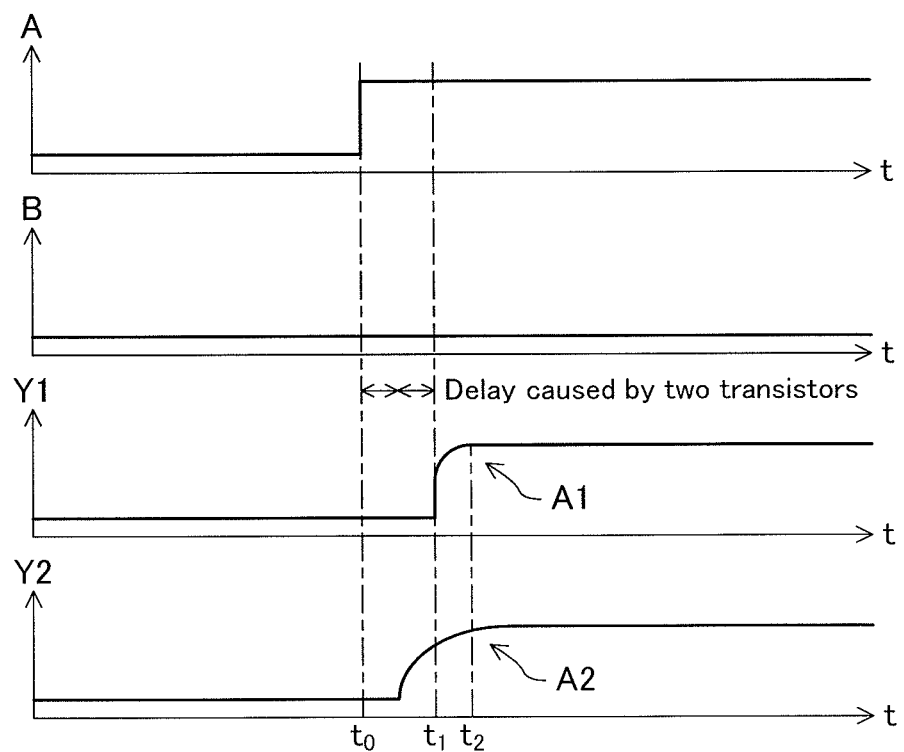
FIG. 6 is a waveform diagram showing voltage changes of the output signals obtained by the circuits shown in FIG. 3A and FIG. 5A.

In FIG. 6, the output signal Y shown in FIG. 3A is referred to as Y1, and the output signal Y shown in FIG. 5A is referred to as Y2. As shown in FIG. 6, after the logic level of the first signal A becomes "1" at time $t_0$, the output signal Y1 starts to rise at time $t_1$. The time $t_1$ to $t_0$ is equal to the delay caused by two transistors. The process of rising is completed at time $t_2$. The output signal Y2 starts to rise earlier than the output signal Y1. As is obvious from FIG. 5, the reason is that the output signal Y2 is delayed only by an amount equivalent to one transistor. However, the process of rising is completed later than time $t_2$. The reason is that the logic circuit shown in FIG. 5A has no driver capability as described above.

As described above, the logic circuit 1 of the present embodiment itself has a drive capability in any logic state. Therefore, it is possible to reduce the dullness of the waveforms of the output signals Y and Y_n. Another advantage is that, as the dullness of the waveforms is reduced, the time required for the input signals (first and second signals A and B) to start changing and then for the rising processes of the output signals Y and Y_n to be completed becomes short.

Furthermore, the logic circuit 1 itself has an amplification capability. Therefore, even if the load of a subsequent circuit (not shown) is large, there is no need to place an amplification inverter, which is used to amplify an output signal of the logic circuit 1.

The above has described the logic circuit 1 that is used independently. However, in particular, the logic circuits 1 are suitable for a multi-stage structure. The following describes an example of making a multi-stage structure of logic circuits 1.

Figure 7:
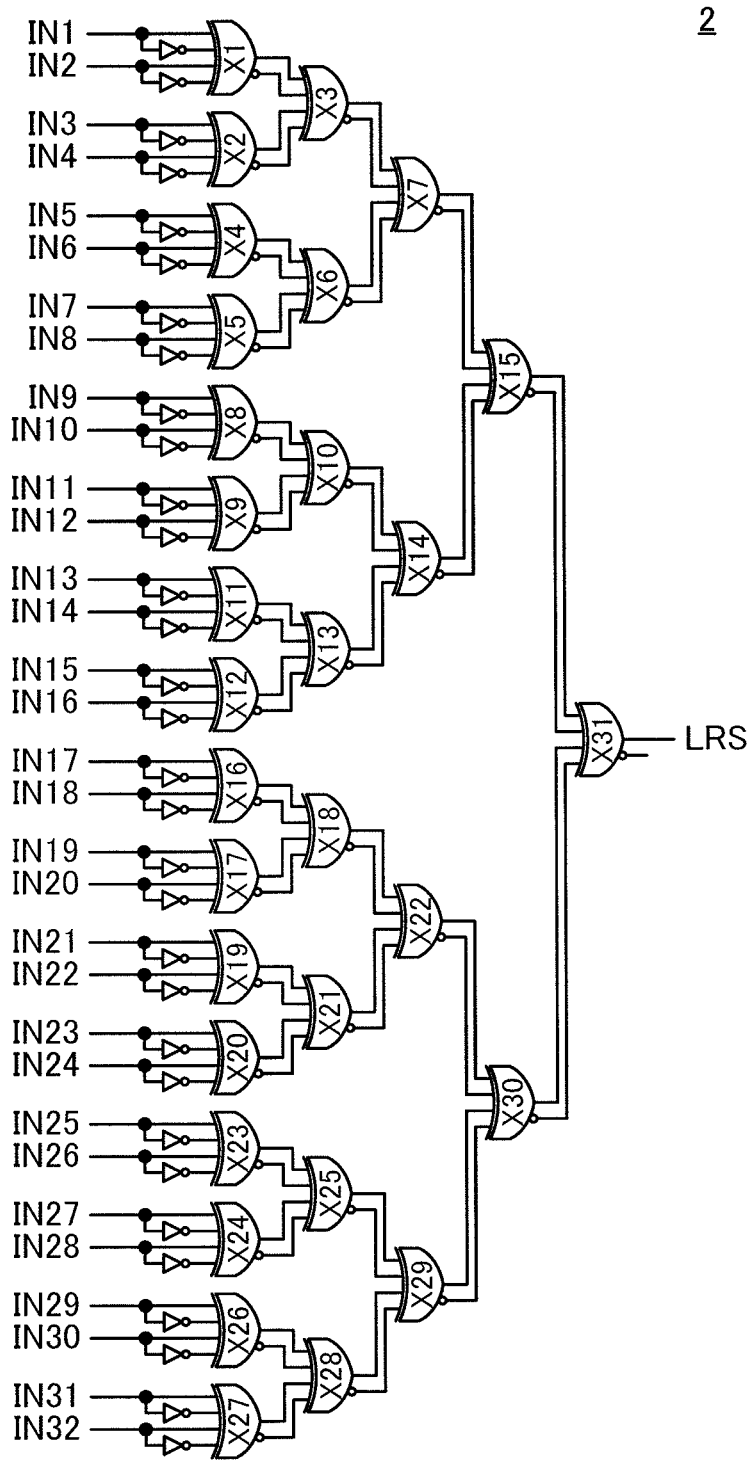
FIG. 7 is a diagram showing a compound logic circuit that is made up of five stages of logic circuits shown in FIG. 1B.

As shown in FIG. 7, the compound logic circuit 2 includes first to thirty-first logic circuits X1 to X31, which all are the above-described logic circuits 1.

As shown in FIG. 7, as for the first stage, a first input signal IN1, an inverted signal of the first input signal IN1, a second input signal IN2, and an inverted signal of the second input signal IN2 are supplied to the first to fourth input nodes i1 to i4 (see FIG. 1B) of the first logic circuit X1, respectively. A third input signal IN3, an inverted signal of the third input signal IN3, a fourth input signal IN4, and an inverted signal of the fourth input signal IN4 are supplied to the first to fourth input nodes i1 to i4 of the second logic circuit X2, respectively. Similarly, the fifth to thirty-second input signals IN5 to IN32 and the inverted signals of the fifth to thirty-second input signals IN5 to IN32 are supplied to the first to fourth input nodes i1 to i4 of the $n^{th}$ logic circuit Xn (n=4, 5, 8, 9, 11, 12, 16, 17, 19, 20, 23, 24, 26, and 27).

As for the second stage, the first output node o1 of the first logic circuit X1 (see FIG. 1B; the same hereinafter), the second output node o2 of the first logic circuit X1, the first output node o1 of the second logic circuit X2, and the second output node o2 of the second logic circuit X2 are connected to the first to fourth input nodes i1 to i4 of the third logic circuit X3, respectively. The first output node o1 of the fourth logic circuit X4, the second output node o2 of the fourth logic circuit X4, the first output node o1 of the fifth logic circuit X5, and the second output node o2 of the fifth logic circuit X5 are connected to the first to fourth input nodes i1 to i4 of the sixth logic circuit X6, respectively. Similarly, the first and second output nodes o1 and o2 of the $l^{th}$ logic circuit X1 (l=8, 9, 11, 12, 16, 17, 19, 20, 23, 24, 26, and 27) are connected to the first to fourth input nodes i1 to i4 of the $m^{th}$ logic circuit Xm (m=10, 12, 18, 21, 25, and 28).

As for the third stage, the first output node o1 of the third logic circuit X3, the second output node o2 of the third logic circuit X3, the first output node o1 of the sixth logic circuit X6, and the second output node o2 of the sixth logic circuit X6 are connected to the first to fourth input nodes i1 to i4 of the seventh logic circuit X7, respectively. The first output node o1 of the tenth logic circuit X10, the second output node o2 of the tenth logic circuit X10, the first output node o1 of the twelfth logic circuit X12, and the second output node o2 of the twelfth logic circuit X12 are connected to the first to fourth input nodes i1 to i4 of the fourteenth logic circuit X14, respectively. Similarly, the first and second output nodes o1 and o2 of the eighteenth, twenty-first, twenty-fifth, and twenty-eighth logic circuits X18, X21, X25, and X28 are connected to the first to fourth input nodes i1 to i4 of the twenty-second and twenty-ninth logic circuits X22 and X29.

As for the fourth stage, the first output node o1 of the seventh logic circuit X7, the second output node o2 of the seventh logic circuit X7, the first output node o1 of the fourteenth logic circuit X14, and the second output node o2 of the fourteenth logic circuit X14 are connected to the first to fourth input nodes it to i4 of the fifteenth logic circuit X15, respectively. The first output node o1 of the twenty-second logic circuit X22, the second output node o2 of the twenty-second logic circuit X22, the first output node o1 of the twenty-ninth logic circuit X29, and the second output node o2 of the twenty-ninth logic circuit X29 are connected to the first to fourth input nodes i1 to i4 of the thirtieth logic circuit X30, respectively.

Finally, as for the fifth stage, the first output node o1 of the fifteenth logic circuit X15, the second output node o2 of the fifteenth logic circuit X15, the first output node o1 of the thirtieth logic circuit X30, and the second output node o2 of the thirtieth logic circuit X30 are connected to the first to fourth input nodes i1 to i4 of the thirty-first logic circuit X31, respectively.

A signal Y that is output from the first output node o1 of the thirty-first logic circuit X31, which makes up the final stage, turns out to be a logic result signal LRS, which is an output signal of the compound logic circuit 2. According to the above configuration, the logic level of the logic result signal LRS is "1" at a time when the number of signals that are the same in logic level among the first to thirty-second input signals IN1 to IN32 is odd; otherwise, the logic level of the logic result signal LRS is "0." That is, the logic result signal LRS serves as the parity for the first to thirty-second input signals IN1 to IN32.

As described above, the compound logic circuit 2 that calculates the parity of the input signals can be formed by making a multi-stage structure of the logic circuits 1 of the present embodiment. Because the logic circuits 1 each have a driver capability, a sufficient amplitude of the logic result signal LRS can be secured. Moreover, the delay in each of the logic circuits 1 is smaller than those in conventional circuits. Therefore, the delay caused by the entire compound logic circuit 2 is also smaller than the conventional case. That is, as the stages increase in number, the high-speed performance of the logic circuits 1 can be fully utilized.

Furthermore, the logic circuits 1 output the results of both exclusive OR (XOR) signal and exclusive NOR (XNOR) signal. Therefore, all the four signals that are necessary as the input signals of a logic circuit 1 can be obtained from the output signals of a preceding logic circuit 1 without inserting an inverter into the signal path. Accordingly, there is no need to provide an inverter between the logic circuits 1 in the compound logic circuit 2. In this manner, it is possible to eliminate the delay caused by such an inverter (or the delay on a critical path).

Incidentally, what is described in the present embodiment is the compound logic circuit that is made up of five stages. However, needless to say, the number of stages is not limited to five. The compound logic circuit can be formed by at least two or more stages of logic circuits 1.

Figure 8:
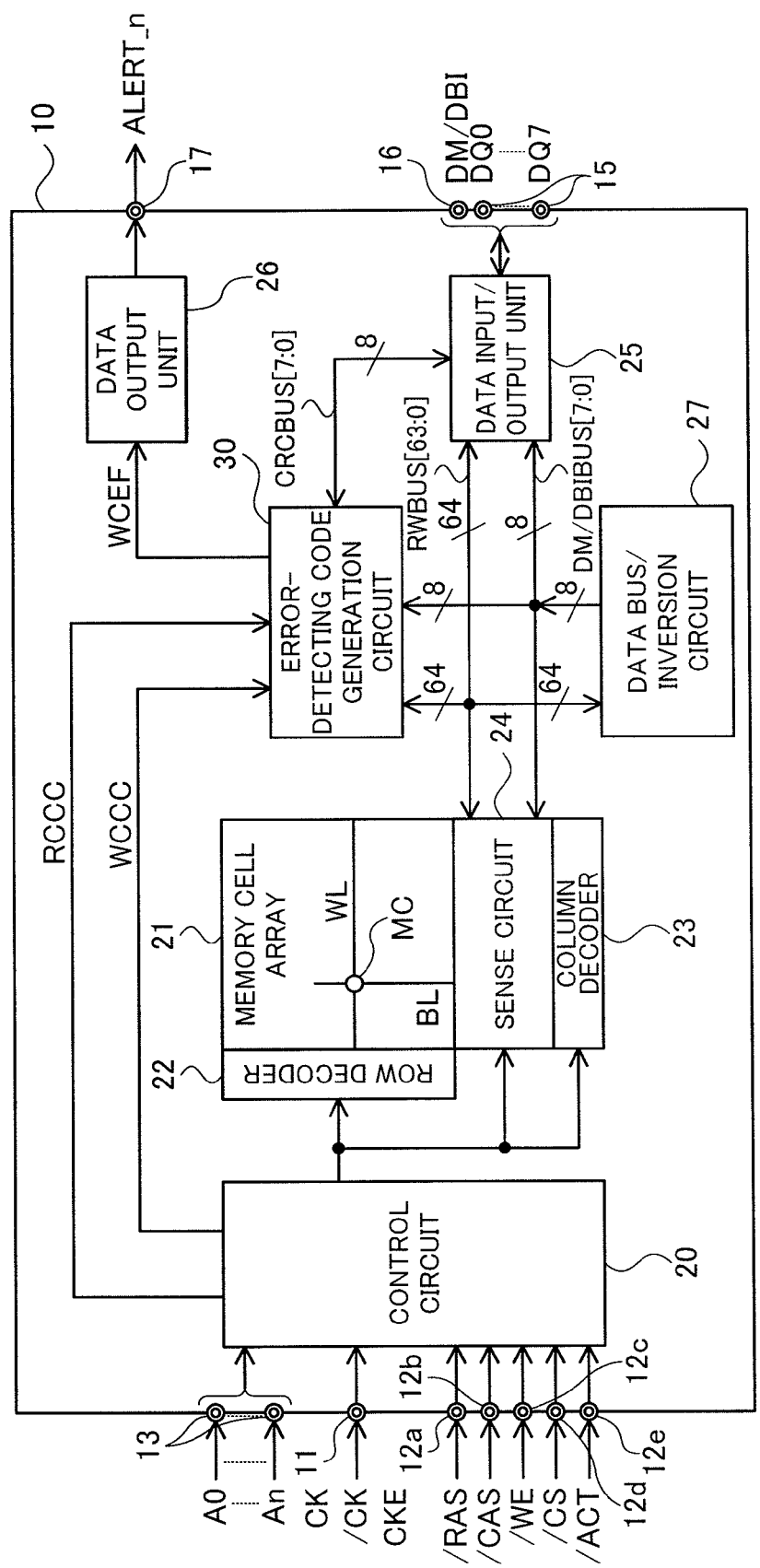
FIG. 8 is a block diagram showing the overall configuration of a semiconductor device according to a second embodiment of the present invention.

A second preferred embodiment of the present invention will be explained with reference to FIG. 8. What is described in the present embodiment is an example in which the above-described logic circuits 1 are applied to a DDR4 DRAM. As described above, in the DDR4 DRAM, a CRC code is added to data signal that are input and output through data input/output terminals. According to the present embodiment, the logic circuits 1 are used in generating the CRC code.

The semiconductor device 10 is a DDR4 DRAM. As shown in FIG. 8, the semiconductor device 10 includes the following external terminals: clock terminals 11; command terminals 12a to 12e; address terminals 13; data input/output terminals 15 (first external terminals contained in a first port); a DM/DBI terminal 16 (a second external terminal contained in the first port); and an alert terminal 17.

The clock terminals 11 are supplied with external clock signals CK and /CK and a clock enable signal CKE. The external clock signals CK and /CK, which are complementary to each other, and the clock enable signal CKE are supplied to a control circuit 20.

The command terminals 12a to 12e are terminals to which the following signals are supplied: a row address strobe signal /RAS; a column address strobe signal /CAS; a write enable signal /WE; a chip select signal /CS; and an activation command input signal /ACT. The above command signals are supplied to the control circuit 20. The control circuit 20 has a function of retaining a command signal, decoding, and counting, and other functions.

The address terminals 13 are supplied with address signals A0 to An. The address signals A0 to An that are supplied to the address terminals 13 are transferred to the control circuit 20. The control circuit 20 has a function of latching an address signal A0 to An.

The address signals A0 to An specify one or more memory cells in a memory cell array 21. In the memory cell array 21, a plurality of word lines WL and a plurality of bit lines BL cross each other, and memory cells MC are disposed at the intersections of the word and bit lines WL and BL. In a sense circuit 24, a sense amplifier is provided for each bit line BL. A plurality of bit lines BL are connected to the corresponding sense amplifiers in the sense circuit 24. Incidentally, FIG. 8 shows only one word line WL, one bit line BL, and one memory cell MC. The address signals A0 to An indicate a row address which specifies a word line WL, and a column address which specifies a bit line BL or sense amplifier. The row address is supplied to a row decoder 22, and the column address to a column decoder 23.

The row decoder 22 is a circuit that selects a word line WL corresponding to a row address supplied from the control circuit 20 from among a plurality of word lines WL in the memory cell array 21. The column decoder 23 is a circuit that selects a sense amplifier connected to a bit line BL corresponding to a column address supplied from the control circuit 20 from among a plurality of bit lines BL in the memory cell array 21. The sense amplifier selected by the column decoder 23 is connected to a read/write bus RWBUS (referred to as "RWBUS," hereinafter) and a data mask/data inversion bus DM/DBIBUS (referred to as "DBIBUS," hereinafter). As shown in FIG. 8, the former is made up of 64 bus lines; the latter is made up of eight bus lines.

The data input/output terminals 15 are terminals for outputting read data DQ0 to DQ7 and inputting write data DQ0 to DQ7. As shown in FIG. 8, a plurality of data input/output terminals 15 are provided. The data input/output terminals 15 each are connected to a data input/output unit 25. As shown in FIG. 8, the data input/output unit 25 is connected to the sense circuit 24 via RWBUS. During a read operation, 64-bit read data DQ0 to DQ7 are transmitted from the memory cell array 21 to RWBUS. The data input/output unit 25 outputs the 64-bit read data DQ0 to DQ7 to outside in burst mode by using eight data input/output terminals 15, each with a burst length of eight. During a write operation, the 64-bit write data DQ0 to DQ7 in total are input from an external controller in burst mode to each of the eight data input/output terminals 15 with a burst length of eight. The data input/output unit 25 writes the write data DQ0 to DQ7, which are input as described above, into the memory cell array 21 via RWBUS.

A data bus/inversion circuit 27 is a circuit that inverts the read data DQ0 to DQ7 when necessary in such a way that the eight-bit data that are output simultaneously do not contain five or more "0s." The data bus/inversion circuit 27 therefore offers a function of reducing power consumption in the semiconductor 10 and an external controller. That is, the semiconductor device 10 and the external controller have the following characteristic: the semiconductor device 10 and the external controller consume much more power by allowing low-level signals to pass therethrough than allowing high-level signals to pass therethrough. Accordingly, by reducing the number of "0s" that are equivalent to a low level in the read data DQ0 to DQ7, a reduction in power consumption can be achieved.

When carrying out the inversion, the data bus/inversion circuit 27 inverts all the eight bits of target data. For example, if the target eight-bit data are "11100000," the data bus/inversion circuit 27 inverts the data because the data contains five "0s." The resultant data are "00011111." The data bus/inversion circuit 27 generates an inversion information bit (DBI bit), which indicates whether the data have been inverted or not, and outputs the inversion information bit to DBIBUS. The DBI bit is generated for each set of eight-bit data that are simultaneously output. Accordingly, if the burst length is eight, the DBI bits are eight-bit data as shown in FIG. 8. The DBI bits are output from the DM/DBI terminal 16 in synchronism with a process of outputting read data DQ0 to DQ7.

The DBI bit is also used for write data DQ. In this case, an external controller generates the DBI bit. The DBI bits generated by the external controller are input into the semiconductor device 10 via the DM/DBI terminal 16 in synchronism with a process of inputting write data DQ0 to DQ7. The data bus/inversion circuit 27 also performs a process of inverting write data DQ0 to DQ7 flowing through RWBUS on the basis of the input DBI bits.

An error-detecting code generation circuit 30 is a circuit that generates a CRC code of 72-bit data made up of 64-bit data flowing through RWBUS and eight-bit data flowing through DBIBUS. The generation method will be described later in detail. The generated CRC code is eight-bit data.

Figure 9:
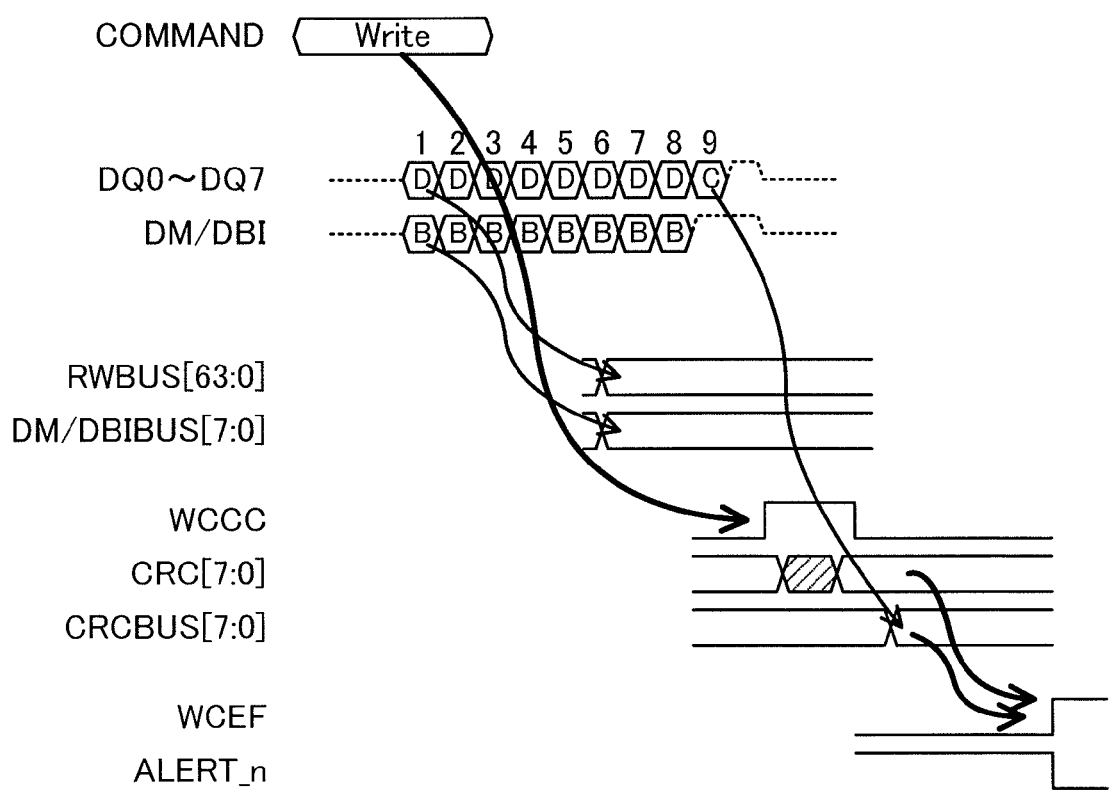
FIG. 9 is a timing chart illustrating a write operation of the semiconductor device shown in FIG. 8.
Figure 10:
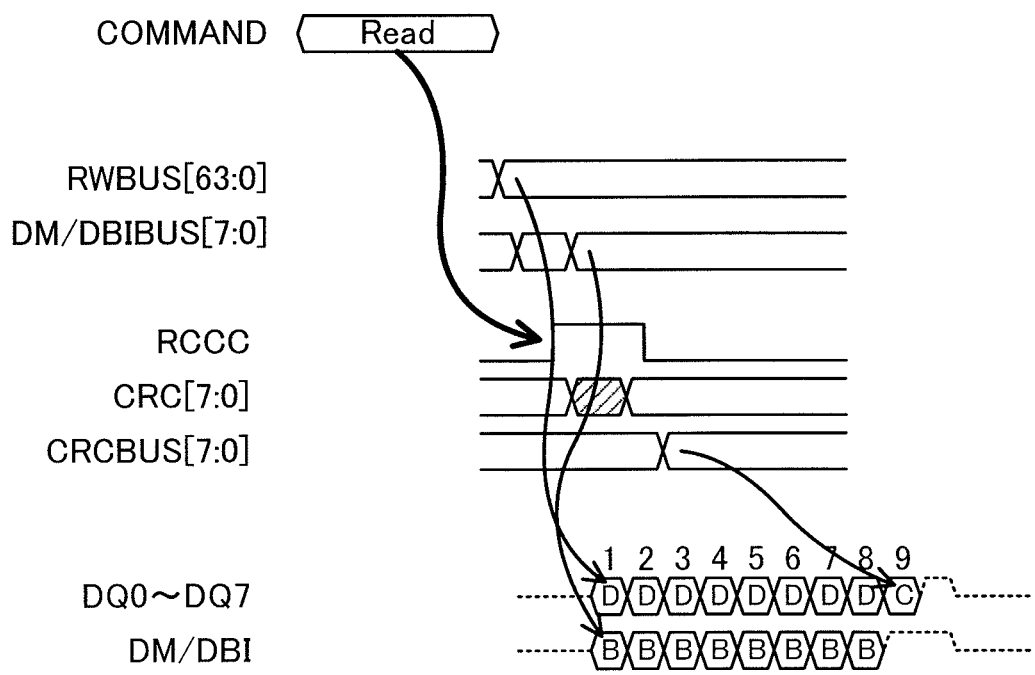
FIG. 10 is a timing chart illustrating a read operation of the semiconductor device shown in FIG. 8.

The write and read operations of the semiconductor device 10 will be explained with reference to FIGS. 9 and 10. What is shown in FIGS. 9 and 10 is an example in which the burst length is eight, and the eight data input/output terminals 15 are used in inputting and outputting read data DQ0 to DQ7 and write data DQ0 to DQ7. Hereinafter, with reference to FIGS. 8 to 10, the process pertaining to CRC codes will be described in detail.

First, as shown in FIG. 9, at the time of writing, a write command Write is supplied from an external controller to the control circuit 20. Then, the external controller inputs in burst mode eight-bit write data DQ0 to DQ7 at intervals of half a clock to the eight data input/output terminals 15. The total 64-bit write data, which are input as described above, are supplied to RWBUS via the data input/output unit 25. At the same time as the write data DQ0 to DQ7 are input, the external controller inputs in burst mode eight DBI bits into the DM/DBI terminal 16. The eight DBI bits, which are input as described above, are supplied to DBIBUS via the data input/output unit 25.

The external controller inputs a one-bit CRC code following the eight-bit write data DQ. The total eight-bit CRC codes, which are input into each data input/output terminal 15, are supplied from the data input/output unit 25 to the error-detecting code generation circuit 30 via a CRC bus CRCBUS (referred to as "CRCBUS," hereinafter), which is made up of eight bus lines.

The control circuit 20 activates a write CRC control clock signal WCCC after the write command Write is supplied. In response, the error-detecting code generation circuit 30 generates an eight-bit CRC code on the basis of the total 72-bit data consisting of the 64-bit write data DQ supplied to RWBUS and the eight DBI bits supplied to DBIBUS. The error-detecting code generation circuit 30 then compares the eight-bit CRC code with a eight-bit CRC code supplied from the external controller. If both match, a process of writing write data DQ is carried out as usual. If both do not match, the error-detecting code generation circuit 30 activates a write CRC error flag WCEF, and supplies the write CRC error flag WCEF to a data output unit 26. In response to the activation of the write CRC error flag WCEF, the data output unit 26 activates an alert signal ALERT_n (to a low level), which is a low-active signal. After detecting the activation of the alert signal ALERT_n, the external controller determines that the writing operation has failed, and then starts the writing operation again when necessary.

As shown in FIG. 10, at the time of reading, a read command Read is supplied from the external controller to the control circuit 20. In response, the control circuit 20 starts a process of reading data from the memory cell array 21. As a result, after a predetermined period of time has passed since the read command Read is input, 64-bit read data DQ are supplied to RWBUS. After that, the data bus/inversion circuit 27 calculates DBI bits. Then, eight DBI bits are supplied to DBIBUS.

At a time when the process of calculating the DBI bits is completed, the control circuit 20 activates a read CRC control clock signal RCCC. Accordingly, the error-detecting code generation circuit 30 generates an eight-bit CRC code on the basis of the total 72-bit data consisting of the 64-bit read data DQ supplied to RWBUS and the eight DBI bits supplied to DBIBUS. The eight-bit CRC code, which is generated as described above, is supplied to the data input/output unit 25 via CRCBUS.

The data input/output unit 25 outputs in burst mode the eight-bit read data DQ0 to DQ7 at intervals of half a clock from the eight data input/output terminals 15. At the same time as the read data DQ are output, the eight DBI bits are output in burst mode from the DM/DBI terminal 16. Furthermore, the data input/output unit 25 outputs, from each of the data input/output terminals 15, a one-bit CRC code following the eight-bit read data DQ0 to DQ7.

The external controller generates an eight-bit CRC code on the basis of the total 72-bit data consisting of the total 64-bit read data DQ and eight DBI bits that are output as described above. Then, the external controller compares the eight-bit CRC code with a total eight-bit CRC code output from the semiconductor device 10. If both match, the external controller accepts the read data DQ. If both do not match, the read operation is carried out again when necessary.

The above has described the overall configuration of the semiconductor device 10 according to the present embodiment. The following describes in detail the configuration and operation of the error-detecting code generation circuit 30.

Figure 11:
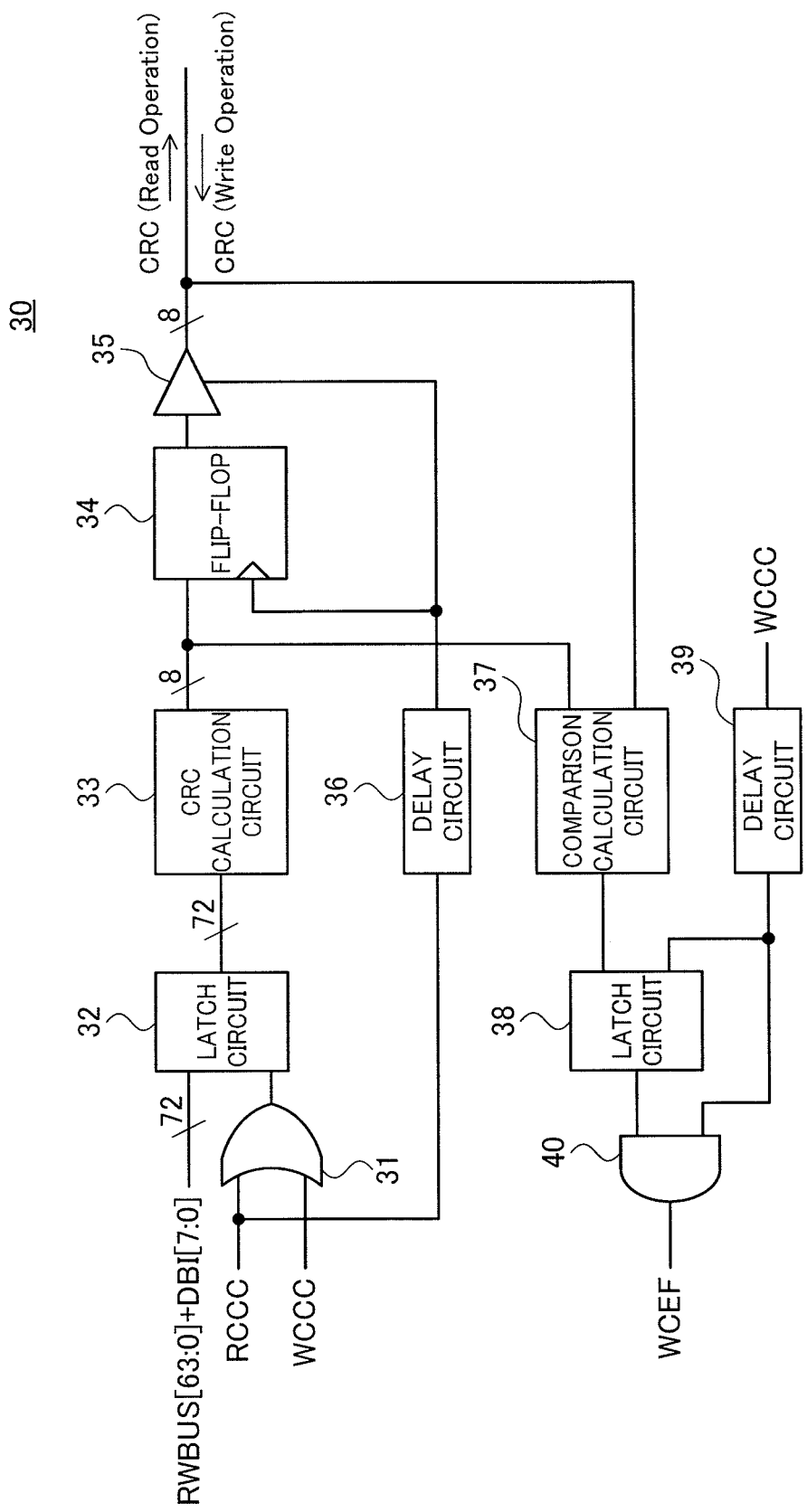
FIG. 11 is a block diagram showing the internal configuration of the error-detecting code generation circuit shown in FIG. 8.

As shown in FIG. 11, the error-detecting code generation circuit 30 includes an OR circuit 31, a latch circuit 32, a CRC calculation circuit 33, a flip-flop 34, a buffer 35, a delay circuit 36, a comparison calculation circuit 37, a latch circuit 38, a delay circuit 39, and an AND circuit 40.

The above-described write CRC control clock signal WCCC and the read CRC control clock signal RCCC are supplied to the OR circuit 31. An output signal of the OR circuit 31 is activated when at least one of the clock signals is activated; otherwise, the output signal of the OR circuit 31 is deactivated.

The latch circuit 32 is a circuit that latches 72-bit data in total, which consist of 64-bit write data DQ and eight DBI bits. As the output signal of the OR circuit 31 is activated, the latch circuit 32 outputs the latched data to the CRC calculation circuit 33.

The CRC calculation circuit 33 (second circuit) is a circuit that generates an eight-bit CRC code CRC[7:0] on the basis of the 72-bit data [72:0] supplied from the latch circuit 32. The CRC calculation circuit 33 includes a compound logic circuit (first circuit), which is made up of the logic circuits 1 described in the first embodiment, for each bit of the CRC code CRC[7:0]. Each bit of the CRC code CRC[7:0] is generated by a corresponding compound logic circuit.

Figure 12:
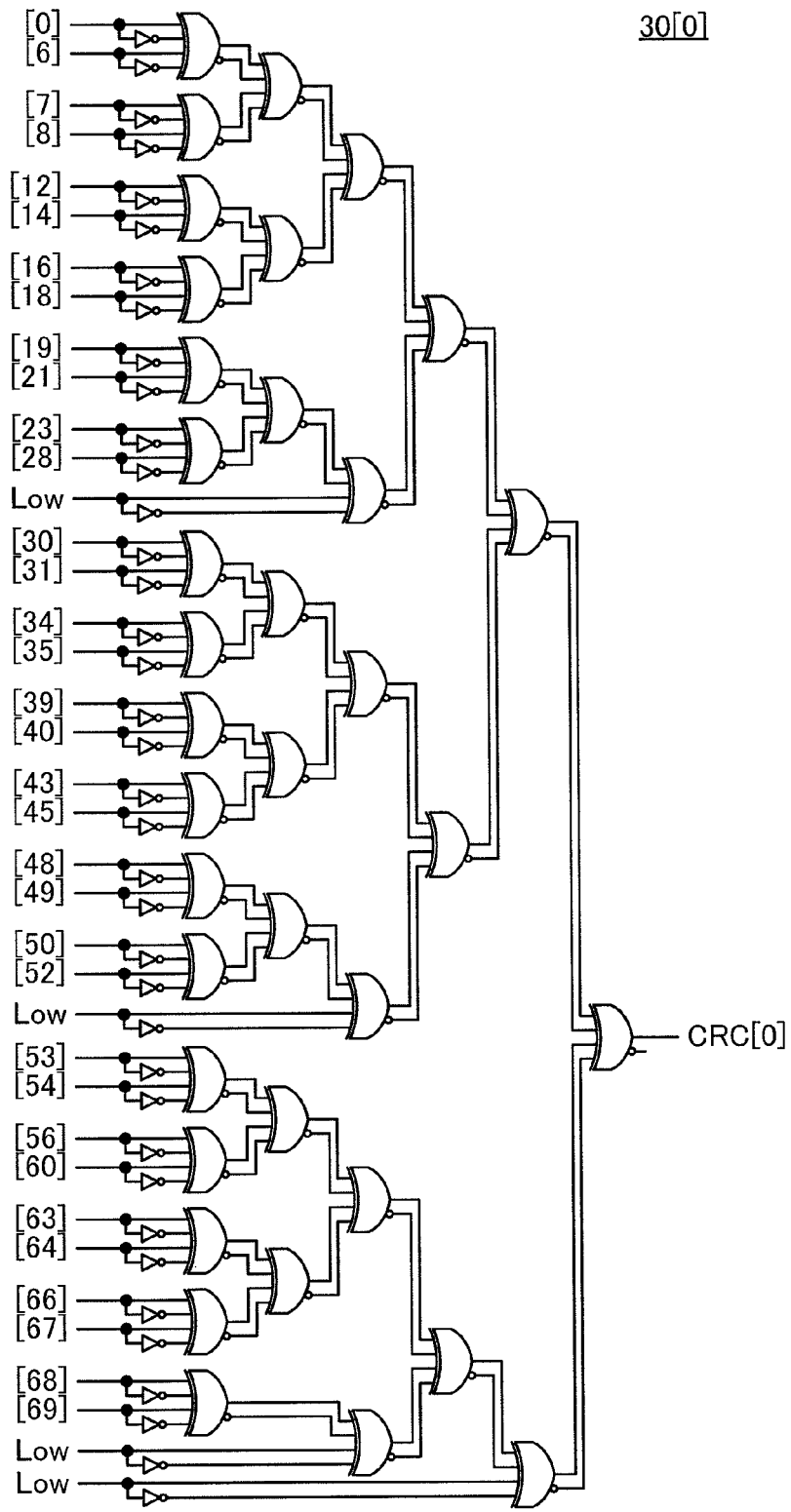
FIG. 12 is a diagram showing a circuit that generates CRC [0] in the CRC code CRC[7:0]

As shown in FIG. 12, the circuit 30[0] is a compound logic circuit that is made up of six stages of the logic circuits 1 put together, which are described in the first embodiment. To the first and third input nodes i1 and i3 (see FIG. 1B) of each of a plurality of logic circuits 1 that make up an input stage of the circuit 30[0], one data set out of data [72:0] is input. To the second and fourth input nodes i2 and i4, the inverted data of the data input into the first and third input nodes i1 and i3 are supplied.

More specifically, the input data are 34 bits in total, including: data [0], data [8:6], data [12], data [14], data data [19:18], data [21], data [23], data [28], data [31:30], data [35:34], data [40:39], data [43], data [45], data [50:48], data [54:52], data [56], data [60], data [64:63], and data [69:66]. The six-stage compound logic circuit is able to accept a maximum of 64 bits' worth ($=2^6$) of input signals. However, in this case, the six-stage compound logic circuit accepts 34 bits. Therefore, in the circuit 30[0], 30 bits' worth (=64-34) of logic circuits 1 are omitted; instead, a signal fixed to a row is supplied.

According to the above configuration, the logic level of the CRC code CRC[0] is "1" at a time when the number of data sets that are equal to each other in logic level in the input 34-bit data is odd; otherwise, the logic level of the CRC code CRC[0] is "0." That is, the CRC code CRC[0] serves as the parity for the input 34-bit data.

The compound logic circuit that generates the other CRC code CRC[7:1] is the same as the compound logic circuit that generates the CRC code CRC[0], even though the combinations of input signals are different. The CRC[7:0], which is generated as described above, is temporarily stored in the flip-flop 34. To a clock terminal of the flip-flop 34, a read CRC control clock signal RCCC is supplied via the delay circuit 36. The delay time of the delay circuit 36 is set in such a way as to supply the read CRC control clock signal RCCC to the clock terminal of the flip-flop 34 at least after the process of generating the CRC code CRC[7:0] is completed. Accordingly, at the time of reading, the CRC code CRC[7:0] generated by the CRC calculation circuit 33 is supplied to the buffer 35, which comes immediately after the flip-flop 34.

The read CRC control clock signal RCCC that has passed through the delay circuit 36 is also supplied to the buffer 35. In this case, the read CRC control clock signal RCCC serves as a control signal that enables the buffer 35 to operate. That is, the signals input into the buffer 35 are able to pass through the buffer 35 during a period when the read CRC control clock signal RCCC is activated. However, the signals are unable to pass through the buffer 35 when the read CRC control clock signal RCCC is not activated. The CRC code CRC[7:0] that has passed through the buffer 35 is supplied to the data input/output unit 25 via CRCBUS, as shown in FIG. 8.

At the time of writing operation, the CRC code CRC[7:0] generated by the CRC calculation circuit 33 is supplied to the comparison calculation circuit 37. To the comparison calculation circuit 37, an eight-bit CRC code (first code data), too, is supplied from an external controller. The comparison calculation circuit 37 compares the CRC codes, and supplies a comparison result signal, which represents a result of comparison thereof, to the latch circuit 38. The comparison result signal is a signal that is at a low level when both match, and at a high level when both do not match.

A write CRC control clock signal WCCC is supplied to the latch circuit 38 via the delay circuit 39. The delay time of the delay circuit 39 is set in such a way as to supply the write CRC control clock signal WCCC to the latch circuit 38 at least after the comparison process by the comparison calculation circuit 37 is completed. The latch circuit 38 outputs a comparison calculation signal to the AND circuit 40 after the write CRC control clock signal WCCC input becomes activated.

The write CRC control clock signal WCCC that has passed through the delay circuit 39 is supplied to the AND circuit 40 along with the comparison calculation signal. Accordingly, an output signal of the AND circuit 40 is at a high level at a time when the comparison calculation signal is activated during a period when the write CRC control clock signal WCCC is activated; otherwise, the output signal of the AND circuit 40 is at a low level. The output signal of the AND circuit 40 is supplied to the data output unit 26 shown in FIG. 1 as a write CRC error flag WCEF.

As described above, the semiconductor device 10 of the present embodiment can generate a CRC code using the logic circuits 1. Because the delay in the logic circuits 1 is smaller than in the conventional XOR gate circuits and other circuits as described in the first embodiment, it is possible to shorten the time required to generate a CRC code (which is equivalent to the hatched portions shown in FIGS. 9 and 10) by using the logic circuits 1 to generate the CRC code.

A data processing system that uses the semiconductor device 10 of the present embodiment will be explained with reference to FIG. 13.

Figure 13:
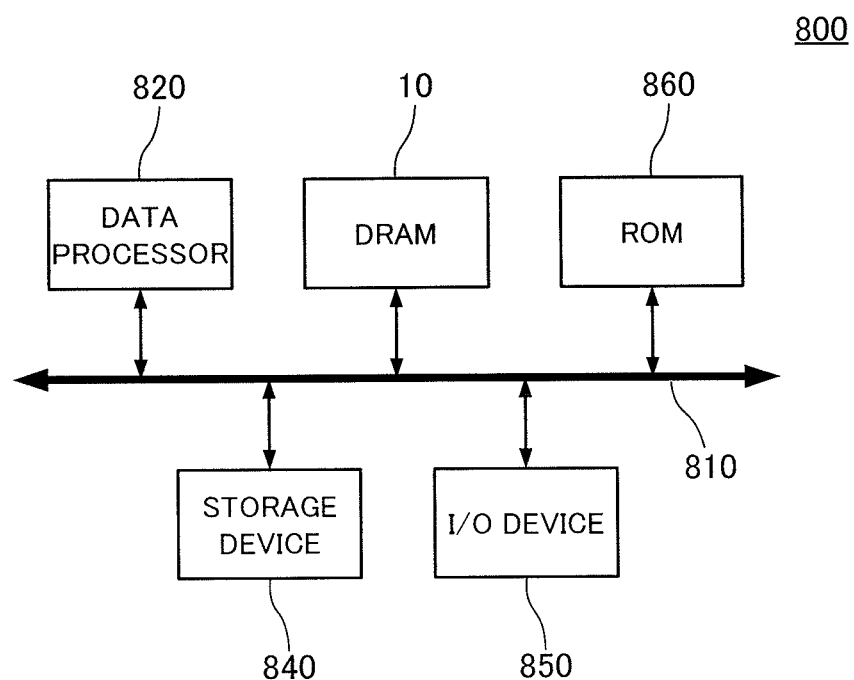
FIG. 13 is a block diagram showing the configuration of a data processing system that uses the semiconductor device shown in FIG. 8.

As shown in FIG. 13, a data processing system 800 is so formed that the following components are connected together via a system bus 810: a data processor 820 (controller); a DRAM 10, which is the semiconductor device 10 of the present embodiment; a storage device 840; an I/O device 850; and a ROM 860. The system bus 810 contains a plurality of signal lines corresponding to the following terminals that the semiconductor device 10 (FIG. 8) includes: the clock terminal 11; the command terminals 12a to 12e; the address terminals 13; the data input/output terminals 15 (first external terminals contained in a first port); the DM/DBI terminal 16 (a second external terminal contained in the first port); and the alert terminal 17. The data processor 820 includes a plurality of external terminals corresponding to a plurality of the signal lines.

The data processor 820 contains the above-described logic circuit 1. The data processor 820 has a function of supplying the external clock signals CK and/CK to the DRAM 10, receiving output signals (read data DQ and CRC codes) of a data input/output unit (FIG. 8) of the DRAM 10, and carrying out a process corresponding to the received read data DQ. The process includes an operation of generating a CRC code on the basis of the read data DQ supplied from the DRAM 10, and an operation of checking the CRC code supplied from the DRAM 10 against the CRC code generated by the data processor 820. In generating and checking the CRC codes, the above-described logic circuit 1 is employed. When data are supplied from the data processor 820 to the DRAM 10, output signals (write data signals and CRC codes) are output from the data input/output unit of the data processor 820. That is, the data processor 820 has a function of carrying out a process that includes an operation of generating a CRC code on the basis of write data DQ to be output. In generating the CRC code, the above-described logic circuit 1 is employed. More specifically, for example, a microprocessor (MPU), a digital signal processor (DSP), or the like may be used as the data processor 820. Incidentally, the data processor 820 and the DRAM 10 may be connected together via a local bus, not via the system bus 810.

A hard disk drive, an optical disc drive, a flash memory, or the like may be used as the storage device 840. As the I/O device 850, a display device such as a liquid crystal display, an input device such as a keyboard or mouse, or the like may be used. Incidentally, the I/O device 850 may be either the input or output device.

For ease of explanation, FIG. 13 shows only one system bus 810. However, a plurality of system buses 810 may be provided in a serial or parallel manner via a connector and the like when necessary. The storage device 840, the I/O device 850, and the ROM 860 are not necessarily essential components. Furthermore, for each type of parts shown in FIG. 13, only one component is depicted for ease of explanation. However, the present invention is not limited to the above. A plurality of components may be provided for one type of parts; or a plurality of components may be provided for each of two or more types of parts.

The above has described the preferred embodiments of the present invention. However, the present invention is not limited to the above-described embodiments. Needless to say, various modifications may be made without departing from the true spirit of the present invention, and the modifications are also within the scope of the present invention. Needless to say, the use of the above-described logic circuits 1 is not limited to a circuit that generates a CRC code from a plurality of bits; the logic circuits 1 may also be applied to logic circuits, including widely-known ECC (Error Check and Correct) circuits.

For example, what is described in the above second embodiment is an example in which the logic circuits 1 of the present invention are applied to the DRAM. However, the use of the logic circuits 1 is not limited to the DRAM. The logic circuits 1 can be applied in a very wide area, ranging from typical LSIs to logic circuits. In particular, the logic circuits 1 can be effectively utilized as large XOR circuits and XNOR circuits, which need to operate at high speed. When a first semiconductor device communicates with a second semiconductor device using signals, the above-described logic circuits 1 may be applied to at least the first or second semiconductor device. The signals and CRC codes may be transmitted via two different signal lines.

The memory cells of the present invention may be volatile or nonvolatile; or the memory cells of the present invention may contain both volatile or nonvolatile cells.

The technical ideas of the present application can be applied to a semiconductor device having a signal transmission circuit. For example, the technical ideas of the present application can also be applied to the command signals that pass through the command terminals 12a to 12e of the semiconductor device 10 (FIG. 8), and the address signals that pass through the address terminals 13. The control circuit 20 includes the above-described logic circuits 1, generates a CRC code pertaining to at least the command or address signals, and checks the CRC code. Furthermore, a circuitry form in each of the circuit blocks disclosed in the drawings, as well as a circuit that generates other control signals, is not limited to the circuitry form disclosed in the examples.

The present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors that constitute a logic gate and the like are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following semiconductor devices and a data processing system.

A first semiconductor device according to one aspect of the present invention includes first to third logic circuits each having a circuit configuration shown in FIGS. 1A and 1B. The first logic circuit has a first input node supplied with a first signal, a second input node supplied with an inverted signal of the first signal, a third input node supplied with a second signal, and a fourth input node supplied with an inverted signal of the second signal. The second logic circuit has a first input node supplied with a third signal, a second input node supplied with an inverted signal of the third signal, a third input node supplied with a fourth signal, and a fourth input node supplied with an inverted signal of the fourth signal. The third logic circuit has a first input node coupled to a first output node of the first logic circuit, a second input node coupled to a second output node of the first logic circuit, a third input node coupled to a first output node of the second logic circuit, and a fourth input node coupled to a second output node of the second logic circuit.

A second semiconductor device according to one aspect of the present invention includes first to seventh logic circuits each having a circuit configuration shown in FIGS. 1A and 1B. The first logic circuit has a first input node supplied with a first signal, a second input node supplied with an inverted signal of the first signal, a third input node supplied with a second signal, and a fourth input node supplied with an inverted signal of the second signal. The second logic circuit has a first input node supplied with a third signal, a second input node supplied with an inverted signal of the third signal, a third input node supplied with a fourth signal, and a fourth input node supplied with an inverted signal of the fourth signal. The fourth logic circuit has a first input node supplied with a fifth signal, a second input node supplied with an inverted signal of the fifth signal, a third input node supplied with a sixth signal, and a fourth input node supplied with an inverted signal of the sixth signal. The fifth logic circuit has a first input node supplied with a seventh signal, a second input node supplied with an inverted signal of the seventh signal, a third input node supplied with an eighth signal, and a fourth input node supplied with an inverted signal of the eighth signal. The third logic circuit has a first input node coupled to a first output node of the first logic circuit, a second input node coupled to a second output node of the first logic circuit, a third input node coupled to a first output node of the second logic circuit, and a fourth input node coupled to a second output node of the second logic circuit. The sixth logic circuit has a first input node coupled to a first output node of the fourth logic circuit, a second input node coupled to a second output node of the fourth logic circuit, a third input node coupled to a first output node of the fifth logic circuit, and a fourth input node coupled to a second output node of the fifth logic circuit. The seventh logic circuit has a first input node coupled to a first output node of the third logic circuit, a second input node coupled to a second output node of the third logic circuit, a third input node coupled to a first output node of the sixth logic circuit, and a fourth input node coupled to a second output node of the sixth logic circuit.

A third semiconductor device according to one aspect of the present invention includes first to fifteenth logic circuits each having a circuit configuration shown in FIGS. 1A and 1B. The first logic circuit has a first input node supplied with a first signal, a second input node supplied with an inverted signal of the first signal, a third input node supplied with a second signal, and a fourth input node supplied with an inverted signal of the second signal. The second logic circuit has a first input node supplied with a third signal, a second input node supplied with an inverted signal of the third signal, a third input node supplied with a fourth signal, and a fourth input node supplied with an inverted signal of the fourth signal. The fourth logic circuit has a first input node supplied with a fifth signal, a second input node supplied with an inverted signal of the fifth signal, a third input node supplied with a sixth signal, and a fourth input node supplied with an inverted signal of the sixth signal. The fifth logic circuit has a first input node supplied with a seventh signal, a second input node supplied with an inverted signal of the seventh signal, a third input node supplied with an eighth signal, and a fourth input node supplied with an inverted signal of the eighth signal. The eighth logic circuit has a first input node supplied with a ninth signal, a second input node supplied with an inverted signal of the ninth signal, a third input node supplied with a tenth signal, and a fourth input node supplied with an inverted signal of the tenth signal. The ninth logic circuit has a first input node supplied with an eleventh signal, a second input node supplied with an inverted signal of the eleventh signal, a third input node supplied with a twelfth signal, and a fourth input node supplied with an inverted signal of the twelfth signal. The eleventh logic circuit has a first input node supplied with a thirteenth signal, a second input node supplied with an inverted signal of the thirteenth signal, a third input node supplied with a fourteenth signal, and a fourth input node supplied with an inverted signal of the fourteenth signal. The twelfth logic circuit has a first input node supplied with a fifteenth signal, a second input node supplied with an inverted signal of the fifteenth signal, a third input node supplied with a sixteenth signal, and a fourth input node supplied with an inverted signal of the sixteenth signal. The third logic circuit has a first input node coupled to a first output node of the first logic circuit, a second input node coupled to a second output node of the first logic circuit, a third input node coupled to a first output node of the second logic circuit, and a fourth input node coupled to a second output node of the second logic circuit. The sixth logic circuit has a first input node coupled to a first output node of the fourth logic circuit, a second input node coupled to a second output node of the fourth logic circuit, a third input node coupled to a first output node of the fifth logic circuit, and a fourth input node coupled to a second output node of the fifth logic circuit. The seventh logic circuit has a first input node coupled to a first output node of the third logic circuit, a second input node coupled to a second output node of the third logic circuit, a third input node coupled to a first output node of the sixth logic circuit, and a fourth input node coupled to a second output node of the sixth logic circuit. The tenth logic circuit has a first input node coupled to a first output node of the eighth logic circuit, a second input node coupled to a second output node of the eighth logic circuit, a third input node coupled to a first output node of the ninth logic circuit, and a fourth input node coupled to a second output node of the ninth logic circuit. The thirteenth logic circuit has a first input node coupled to a first output node of the eleventh logic circuit, a second input node coupled to a second output node of the eleventh logic circuit, a third input node coupled to a first output node of the twelfth logic circuit, and a fourth input node coupled to a second output node of the twelfth logic circuit. The fourteenth logic circuit has a first input node coupled to a first output node of the tenth logic circuit, a second input node coupled to a second output node of the tenth logic circuit, a third input node coupled to a first output node of the thirteenth logic circuit, and a fourth input node coupled to a second output node of the thirteenth logic circuit. The fifteenth logic circuit has a first input node coupled to a first output node of the seventh logic circuit, a second input node coupled to a second output node of the seventh logic circuit, a third input node coupled to a first output node of the fourteenth logic circuit, and a fourth input node coupled to a second output node of the fourteenth logic circuit.

A fourth semiconductor device according to one aspect of the present invention includes first to thirty-first logic circuits each having a circuit configuration shown in FIGS. 1A and 1B. The first logic circuit has a first input node supplied with a first signal, a second input node supplied with an inverted signal of the first signal, a third input node supplied with a second signal, and a fourth input node supplied with an inverted signal of the second signal. The second logic circuit has a first input node supplied with a third signal, a second input node supplied with an inverted signal of the third signal, a third input node supplied with a fourth signal, and a fourth input node supplied with an inverted signal of the fourth signal. The fourth logic circuit has a first input node supplied with a fifth signal, a second input node supplied with an inverted signal of the fifth signal, a third input node supplied with a sixth signal, and a fourth input node supplied with an inverted signal of the sixth signal. The fifth logic circuit has a first input node supplied with a seventh signal, a second input node supplied with an inverted signal of the seventh signal, a third input node supplied with an eighth signal, and a fourth input node supplied with an inverted signal of the eighth signal. The eighth logic circuit has a first input node supplied with a ninth signal, a second input node supplied with an inverted signal of the ninth signal, a third input node supplied with a tenth signal, and a fourth input node supplied with an inverted signal of the tenth signal. The ninth logic circuit has a first input node supplied with an eleventh signal, a second input node supplied with an inverted signal of the eleventh signal, a third input node supplied with a twelfth signal, and a fourth input node supplied with an inverted signal of the twelfth signal. The eleventh logic circuit has a first input node supplied with a thirteenth signal, a second input node supplied with an inverted signal of the thirteenth signal, a third input node supplied with a fourteenth signal, and a fourth input node supplied with an inverted signal of the fourteenth signal. The twelfth logic circuit has a first input node supplied with a fifteenth signal, a second input node supplied with an inverted signal of the fifteenth signal, a third input node supplied with a sixteenth signal, and a fourth input node supplied with an inverted signal of the sixteenth signal. The sixteenth logic circuit has a first input node supplied with a seventeenth signal, a second input node supplied with an inverted signal of the seventeenth signal, a third input node supplied with an eighteenth signal, and a fourth input node supplied with an inverted signal of the eighteenth signal. The seventeenth logic circuit has a first input node supplied with a nineteenth signal, a second input node supplied with an inverted signal of the nineteenth signal, a third input node supplied with a twentieth signal, and a fourth input node supplied with an inverted signal of the twentieth signal. The nineteenth logic circuit has a first input node supplied with a twenty-first signal, a second input node supplied with an inverted signal of the twenty-first signal, a third input node supplied with a twenty-second signal, and a fourth input node supplied with an inverted signal of the twenty-second signal. The twentieth logic circuit has a first input node supplied with a twenty-third signal, a second input node supplied with an inverted signal of the twenty-third signal, a third input node supplied with a twenty-fourth signal, and a fourth input node supplied with an inverted signal of the twenty-fourth signal. The twenty-third logic circuit has a first input node supplied with a twenty-fifth signal, a second input node supplied with an inverted signal of the twenty-fifth signal, a third input node supplied with a twenty-sixth signal, and a fourth input node supplied with an inverted signal of the twenty-sixth signal. The twenty-fourth logic circuit has a first input node supplied with a twenty-seventh signal, a second input node supplied with an inverted signal of the twenty-seventh signal, a third input node supplied with a twenty-eighth signal, and a fourth input node supplied with an inverted signal of the twenty-eighth signal. The twenty-sixth logic circuit has a first input node supplied with a twenty-ninth signal, a second input node supplied with an inverted signal of the twenty-ninth signal, a third input node supplied with a thirtieth signal, and a fourth input node supplied with an inverted signal of the thirtieth signal. The twenty-seventh logic circuit has a first input node supplied with a thirty-first signal, a second input node supplied with an inverted signal of the thirty-first signal, a third input node supplied with a thirty-second signal, and a fourth input node supplied with an inverted signal of the thirty-second signal. The third logic circuit has a first input node coupled to a first output node of the first logic circuit, a second input node coupled to a second output node of the first logic circuit, a third input node coupled to a first output node of the second logic circuit, and a fourth input node coupled to a second output node of the second logic circuit. The sixth logic circuit has a first input node coupled to a first output node of the fourth logic circuit, a second input node coupled to a second output node of the fourth logic circuit, a third input node coupled to a first output node of the fifth logic circuit, and a fourth input node coupled to a second output node of the fifth logic circuit. The seventh logic circuit has a first input node coupled to a first output node of the third logic circuit, a second input node coupled to a second output node of the third logic circuit, a third input node coupled to a first output node of the sixth logic circuit, and a fourth input node coupled to a second output node of the sixth logic circuit. The tenth logic circuit has a first input node coupled to a first output node of the eighth logic circuit, a second input node coupled to a second output node of the eighth logic circuit, a third input node coupled to a first output node of the ninth logic circuit, and a fourth input node coupled to a second output node of the ninth logic circuit. The thirteenth logic circuit has a first input node coupled to a first output node of the eleventh logic circuit, a second input node coupled to a second output node of the eleventh logic circuit, a third input node coupled to a first output node of the twelfth logic circuit, and a fourth input node coupled to a second output node of the twelfth logic circuit. The fourteenth logic circuit has a first input node coupled to a first output node of the tenth logic circuit, a second input node coupled to a second output node of the tenth logic circuit, a third input node coupled to a first output node of the thirteenth logic circuit, and a fourth input node coupled to a second output node of the thirteenth logic circuit. The fifteenth logic circuit has a first input node coupled to a first output node of the seventh logic circuit, a second input node coupled to a second output node of the seventh logic circuit, a third input node coupled to a first output node of the fourteenth logic circuit, and a fourth input node coupled to a second output node of the fourteenth logic circuit. The eighteenth logic circuit has a first input node coupled to a first output node of the sixteenth logic circuit, a second input node coupled to a second output node of the sixteenth logic circuit, a third input node coupled to a first output node of the seventeenth logic circuit, and a fourth input node coupled to a second output node of the seventeenth logic circuit. The twenty-first logic circuit has a first input node coupled to a first output node of the nineteenth logic circuit, a second input node coupled to a second output node of the nineteenth logic circuit, a third input node coupled to a first output node of the twentieth logic circuit, and a fourth input node coupled to a second output node of the twentieth logic circuit. The twenty-second logic circuit has a first input node coupled to a first output node of the eighteenth logic circuit, a second input node coupled to a second output node of the eighteenth logic circuit, a third input node coupled to a first output node of the twenty-first logic circuit, and a fourth input node coupled to a second output node of the twenty-first logic circuit. The twenty-fifth logic circuit has a first input node coupled to a first output node of the twenty-third logic circuit, a second input node coupled to a second output node of the twenty-third logic circuit, a third input node coupled to a first output node of the twenty-fourth logic circuit, and a fourth input node coupled to a second output node of the twenty-fourth logic circuit. The twenty-eighth logic circuit has a first input node coupled to a first output node of the twenty-sixth logic circuit, a second input node coupled to a second output node of the twenty-sixth logic circuit, a third input node coupled to a first output node of the twenty-seventh logic circuit, and a fourth input node coupled to a second output node of the twenty-seventh logic circuit. The twenty-ninth logic circuit has a first input node coupled to a first output node of the twenty-fifth logic circuit, a second input node coupled to a second output node of the twenty-fifth logic circuit, a third input node coupled to a first output node of the twenty-eighth logic circuit, and a fourth input node coupled to a second output node of the twenty-eighth logic circuit. The thirtieth logic circuit has a first input node coupled to a first output node of the twenty-second logic circuit, a second input node coupled to a second output node of the twenty-second logic circuit, a third input node coupled to a first output node of the twenty-ninth logic circuit, and a fourth input node coupled to a second output node of the twenty-ninth logic circuit. The thirty-first logic circuit has a first input node coupled to a first output node of the fifteenth logic circuit, a second input node coupled to a second output node of the fifteenth logic circuit, a third input node coupled to a first output node of the thirtieth logic circuit, and a fourth input node coupled to a second output node of the thirtieth logic circuit.

A fifth semiconductor device according to one aspect of the present invention includes a plurality of bus lines that transmit data signals and a plurality of units each having the same circuit configuration as one of the first to fourth semiconductor devices. Each of the data signals is supplied to one of the first to fourth input nodes of predetermined one of the logic circuits that is arranged at the first stage. The logic circuit arranged at the last stage of each of the plurality of units outputs a logic result signal.

A sixth semiconductor device according to one aspect of the present invention includes a signal port provided to communicate with outside in addition to the fifth semiconductor device. The signal port is supplied with the data signals and code data. The device further includes a comparing circuit that compares the data signals with code data.

A seventh semiconductor device according to one aspect of the present invention includes an alert terminal supplying an alert signal based on comparing result of the comparing circuit in addition to the sixth semiconductor device.

An eighth semiconductor device according to one aspect of the present invention is based on the sixth semiconductor device and is characterized in that the data signals and the code data are successively provided.

A ninth semiconductor device according to one aspect of the present invention is based on the sixth semiconductor device and is characterized in that the data signals constitute data bits and an inversion information bit that indicates whether the data bits are inverted in logic level or not.

A tenth semiconductor device according to one aspect of the present invention is based on the ninth semiconductor device and is characterized in that the signal port includes first and second external terminals. The first external terminal is supplied with the data signals and the code data. The second external terminal is supplied with the inversion information bit.

An eleventh semiconductor device according to one aspect of the present invention includes a signal port provided to communicate with outside in addition to the fifth semiconductor device. The semiconductor device supplies the data signals and the logic result signal.

A twelfth semiconductor device according to one aspect of the present invention is based on the eleventh semiconductor device and is characterized in that the data signals and the logic result signal are successively provided.

A thirteenth semiconductor device according to one aspect of the present invention is based on the eleventh semiconductor device and is characterized in that the data signals constitute data bits and an inversion information bit that indicates whether the data bits are inverted in logic level or not.

A fourteenth semiconductor device according to one aspect of the present invention is based on the thirteenth semiconductor device and is characterized in that the signal port includes first and second external terminals. The first external terminal is supplied with the data signals and the code data. The second external terminal is supplied with the inversion information bit.

A data processing system according to one aspect of the present invention includes any one of the first to fourteenth semiconductor device described above and a controller that controls the semiconductor device.

What is claimed is:

1. A device comprising:
   a first terminal supplied with a first potential;
   a second terminal supplied with a second potential;
   a first transistor coupled between the first terminal and a first node and including a control electrode supplied with a first signal;
   a second transistor coupled between the first terminal and a second node and including a control electrode supplied with an inverted signal of the first signal;
   a third transistor coupled between the second terminal and a third node and including a control electrode supplied with a second signal;
   a fourth transistor coupled between the second terminal and a fourth node and including a control electrode supplied with an inverted signal of the second signal;
   a fifth transistor coupled between the first node and a first output node and including a control electrode supplied with the inverted signal of the second signal;
   a sixth transistor coupled between the second node and the first output node and including a control electrode supplied with the second signal;
   a seventh transistor coupled between the third node and the first output node and including a control electrode supplied with the first signal;
   an eighth transistor coupled between the fourth node and the first output node and including a control electrode supplied with the inverted signal of the first signal;
   a ninth transistor coupled between the first node and a second output node and including a control electrode supplied with the second signal;
   a tenth transistor coupled between the second node and the second output node and including a control electrode supplied with the inverted signal of the second signal;
   an eleventh transistor coupled between the third node and the second output node and including a control electrode supplied with the inverted signal of the first signal; and
   a twelfth transistor coupled between the fourth node and the second output node and including a control electrode supplied with the first signal.

2. The logic circuit as claimed in claim 1, wherein complementary signals are output from the first and second output nodes.

3. The logic circuit as claimed in claim 1, wherein the first, second, fifth, sixth, ninth and tenth transistor have a first conductivity type, and the third, fourth, seventh, eighth, eleventh and twelfth transistor have a second conductivity type opposite to the first conductivity type.

4. The logic circuit as claimed in claim 1, wherein each of the first and second output nodes is coupled to one of the first and second terminals via two of the first to twelfth transistors.

5. The logic circuit as claimed in claim 1, further comprising:
   a first input node supplied with the first signal;
   a second input node supplied with the inverted signal of the first signal;
   a third input node supplied with the second signal; and
   a fourth input node supplied with the inverted signal of the second signal, wherein
   the first input node is coupled to the control electrodes of the first, seventh and twelfth transistors,
   the second input node is coupled to the control electrodes of the second, eighth and eleventh transistors,
   the third input node is coupled to the control electrodes of the third, sixth and ninth transistors, and
   the fourth input node is coupled to the control electrodes of the fourth, fifth and tenth transistors.

6. A data processing system comprising:
   a first semiconductor device generating first and second signals;
   transfer lines transferring the first and second signals; and
   a second semiconductor device receiving the first and second signals via the transfer lines,
   wherein at least one of the first and second semiconductor devices includes a logic circuit, the logic circuit comprising:
   a first terminal supplied with a first potential;
   a second terminal supplied with a second potential;
   a first transistor coupled between the first terminal and a first node and including a control electrode supplied with a first signal;
   a second transistor coupled between the first terminal and a second node and including a control electrode supplied with an inverted signal of the first signal;
   a third transistor coupled between the second terminal and a third node and including a control electrode supplied with a second signal;
   a fourth transistor coupled between the second terminal and a fourth node and including a control electrode supplied with an inverted signal of the second signal;
   a fifth transistor coupled between the first node and a first output node and including a control electrode supplied with the inverted signal of the second signal;
   a sixth transistor coupled between the second node and the first output node and including a control electrode supplied with the second signal;
   a seventh transistor coupled between the third node and the first output node and including a control electrode supplied with the first signal;
   an eighth transistor coupled between the fourth node and the first output node and including a control electrode supplied with the inverted signal of the first signal;
   a ninth transistor coupled between the first node and a second output node and including a control electrode supplied with the second signal;
   a tenth transistor coupled between the second node and the second output node and including a control electrode supplied with the inverted signal of the second signal;

an eleventh transistor coupled between the third node and the second output node and including a control electrode supplied with the inverted signal of the first signal; and a twelfth transistor coupled between the fourth node and the second output node and including a control electrode supplied with the first signal.

7. The data processing system as claimed in claim 6, wherein complementary signals are output from the first and second output nodes.

8. The data processing system as claimed in claim 6, wherein the first, second, fifth, sixth, ninth and tenth transistor have a first conductivity type, and the third, fourth, seventh, eighth, eleventh and twelfth transistor have a second conductivity type opposite to the first conductivity type.

9. The data processing system as claimed in claim 6, wherein each of the first and second output nodes is coupled to one of the first and second terminals via two of the first to twelfth transistors.

10. The data processing system as claimed in claim 6, wherein the logic circuit further comprising:
a first input node supplied with the first signal;
a second input node supplied with the inverted signal of the first signal;
a third input node supplied with the second signal; and
a fourth input node supplied with the inverted signal of the second signal, wherein
the first input node is coupled to the control electrodes of the first, seventh and twelfth transistors,
the second input node is coupled to the control electrodes of the second, eighth and eleventh transistors,
the third input node is coupled to the control electrodes of the third, sixth and ninth transistors, and
the fourth input node is coupled to the control electrodes of the fourth, fifth and tenth transistors.

11. A device comprising:
first and second potential lines;
first, second, third and fourth input nodes;
first and second output nodes;
first, second, third and fourth circuit nodes;
a first transistor coupled between the first potential line and the first circuit node and including a gate coupled to the first input node;
a second transistor coupled between the first potential line and the second circuit node and including a gate coupled to the second input node;
a third transistor coupled between the second potential line and the third circuit node and including a gate coupled to the third input node;
a fourth transistor coupled between the second potential line and the fourth circuit node and including a gate coupled to the fourth input node;
a fifth transistor coupled between the first circuit node and the first output node and including a gate coupled to the fourth input node;
a sixth transistor coupled between the second circuit node and the first output node and including a gate coupled to the third input node;
a seventh transistor coupled between the third circuit node and the first output node and including a gate coupled to the first input node;
an eighth transistor coupled between the fourth circuit node and the first output node and including a gate coupled to the second input node;
a ninth transistor coupled between the first circuit node and the second output node and including a gate coupled to the third input node;
a tenth transistor coupled between the second circuit node and the second output node and including a gate coupled to the fourth input node;
an eleventh transistor coupled between the third circuit node and the second output node and including a gate coupled to the second input node; and
a twelfth transistor coupled between the fourth circuit node and the second output node and including a gate coupled to the first input node.

12. The device as claimed in claim 11, wherein the first input node is supplied with a first signal, the second input node is supplied with an inverted signal of the first signal, the third input node is supplied with a second signal, and the fourth input node is supplied with an inverted signal of the second signal.

13. The device as claimed in claim 11, wherein each of the first, second, fifth, sixth, ninth and tenth transistors is of a first channel type, and each of the third, fourth, seventh, eighth, eleventh and twelfth transistors is of a second channel type.

14. The device as claimed in claim 13, wherein the first input node is supplied with a first signal, the second input node is supplied with an inverted signal of the first signal, the third input node is supplied with a second signal, and the fourth input node is supplied with an inverted signal of the second signal.

* * * * *